United States Patent
Shim et al.

(10) Patent No.: US 8,902,655 B2
(45) Date of Patent: Dec. 2, 2014

(54) NONVOLATILE MEMORY DEVICE PROVIDING NEGATIVE VOLTAGE

(75) Inventors: Sang-Won Shim, Seoul (KR); Pan-Suk Kwak, Seoul (KR); Ki-Tae Park, Seongnam-si (KR); Yoon-Hee Choi, Hwaseong-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 244 days.

(21) Appl. No.: 13/463,063

(22) Filed: May 3, 2012

(65) Prior Publication Data

US 2013/0010539 A1 Jan. 10, 2013

(30) Foreign Application Priority Data

Jul. 6, 2011 (KR) .................. 10-2011-0066943

(51) Int. Cl.
| | | |
|---|---|---|
| G11C 11/34 | (2006.01) | |
| G11C 7/00 | (2006.01) | |
| G04B 25/02 | (2006.01) | |
| G11C 16/10 | (2006.01) | |
| G11C 16/04 | (2006.01) | |
| G11C 16/30 | (2006.01) | |

(52) U.S. Cl.
CPC ............ G11C 16/0433 (2013.01); G11C 16/10 (2013.01); G11C 16/30 (2013.01); G11C 16/0483 (2013.01)
USPC ............ 365/185.11; 365/185.12; 365/185.17; 365/189.11; 365/185.18; 365/230.06

(58) Field of Classification Search
CPC ........ G11C 16/16; G11C 16/08; G11C 16/10; G11C 16/0483; G11C 16/26; G11C 16/30; G11C 16/12; G11C 8/08; G11C 5/145; G11C 7/12; G11C 11/4085; G11C 5/147; H01L 27/115

USPC ............ 365/185.11, 189.11, 230.06, 185.18, 365/185.27, 185.12
See application file for complete search history.

(56) References Cited

U.S. PATENT DOCUMENTS

| | | | |
|---|---|---|---|
| 5,973,963 | A | 10/1999 | Sugawara |
| 6,671,208 | B2 | 12/2003 | Sumitani et al. |
| 6,724,682 | B2 | 4/2004 | Lee et al. |
| 7,092,308 | B2 | 8/2006 | Choi et al. |
| 7,379,333 | B2 | 5/2008 | Lee et al. |

(Continued)

FOREIGN PATENT DOCUMENTS

| | | |
|---|---|---|
| JP | 10-214495 | 8/1998 |
| JP | 2002-133881 A | 5/2002 |

(Continued)

*Primary Examiner* — J. H. Hur
*Assistant Examiner* — Ajay Ojha
(74) *Attorney, Agent, or Firm* — Muir Patent Consulting, PLLC

(57) ABSTRACT

A nonvolatile memory device including memory blocks, a pre-decoder, and a row decoder is disclosed. Each of the memory blocks has a plurality of memory cells. The pre-decoder includes a multiplexer and negative level shifters. The multiplexer is configured to generate multiplexing signals in response to address signals. Each of the negative level shifters is configured to generate a converted multiplexing signal corresponding to a respective multiplexing signal by converting a multiplexing signal having a ground voltage into a converted multiplexing signal having a first negative voltage. The row decoder is configured to select at least one of the memory blocks in response to the converted multiplexing signals.

20 Claims, 23 Drawing Sheets

(56) References Cited

U.S. PATENT DOCUMENTS

| | | |
|---|---|---|
| 7,509,588 B2 | 3/2009 | Van Os et al. |
| 7,548,463 B2 | 6/2009 | Watanabe et al. |
| 2003/0117851 A1* | 6/2003 | Lee et al. .................. 365/185.17 |
| 2009/0310415 A1 | 12/2009 | Jin et al. |
| 2010/0013458 A1 | 1/2010 | Lany et al. |
| 2010/0078701 A1 | 4/2010 | Shim et al. |
| 2010/0082890 A1 | 4/2010 | Heo et al. |
| 2010/0117141 A1 | 5/2010 | Shin et al. |
| 2010/0140685 A1 | 6/2010 | Kang et al. |
| 2010/0213527 A1 | 8/2010 | Shim et al. |
| 2010/0224929 A1 | 9/2010 | Jeong et al. |
| 2010/0306583 A1 | 12/2010 | Kim et al. |
| 2010/0315875 A1 | 12/2010 | Kim et al. |
| 2010/0322000 A1 | 12/2010 | Shim et al. |
| 2011/0018036 A1 | 1/2011 | Hwang et al. |
| 2011/0051520 A1 | 3/2011 | Kim |
| 2011/0069551 A1* | 3/2011 | Kim ........................ 365/185.12 |
| 2011/0096602 A1 | 4/2011 | Kim et al. |

FOREIGN PATENT DOCUMENTS

| | | |
|---|---|---|
| JP | 2007-317247 A | 12/2007 |
| KR | 10-0273493 | 9/2000 |
| KR | 10-2003-0011215 A | 2/2003 |

* cited by examiner

NONVOLATILE MEMORY DEVICE PROVIDING NEGATIVE VOLTAGE

CROSS-REFERENCE TO RELATED APPLICATIONS

This application claims the benefits, under 35 U.S.C. §119, of Korean Patent Application No. 10-2011-0066943 filed Jul. 6, 2011, the entirety of which is incorporated by reference herein.

BACKGROUND

Exemplary embodiments relate to a nonvolatile memory device supplying a negative voltage.

Semiconductor memory devices are a vital microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices and non-volatile memory devices. Non-volatile memories are capable of storing data even when the power is turned off. Non-volatile memory data storage modes include permanent and reprogrammable modes. Non-volatile memories are commonly used for program and microcode storage in a wide variety of applications including computers, avionics, telecommunications, and consumer electronics.

A typical example of a non-volatile memory device is a flash memory device. In recent, multi-bit memory devices storing a multi-bit in a memory cell are becoming more common as demand for the high density of a memory device increases.

SUMMARY

According to an example embodiment, there is provides a nonvolatile memory device. The nonvolatile memory device includes memory blocks, address buffers, pre-decoder, and a row decoder. Each of the memory blocks has a plurality of memory cells. The address buffers are configured to generate address signals. The pre-decoder includes a multiplexer and negative level shifters. The multiplexer is configured to generate multiplexing signals in response to the address signals. Each of the negative level shifters is configured to generate a converted multiplexing signal corresponding to a respective multiplexing signal by converting a multiplexing signal having a ground voltage into a converted multiplexing signal having a first negative voltage. The row decoder is configured to select at least one of the memory blocks in response to the converted multiplexing signals.

According to another example embodiment, a memory device includes a memory cell array, word lines, first and second address buffers, a selection line decoder, pre-decoder, and a row decoder. The memory cell array includes one or more memory blocks and each of the one or more memory bocks has a plurality of memory cell transistors. The word lines are connected to the plurality of memory cell transistors. The first address buffers are configured to output first address signals and the second address buffers are configured to output second address signals. The selection line decoder is configured to generate selection line signals in response to the first address signals. The pre-decoder includes a multiplexer and negative level shifters. The multiplexer is configured to generate multiplexing signals in response to the second address signals. Each of the negative level shifters is configured to generate a converted multiplexing signal corresponding to a respective multiplexing signal by converting a multiplexing signal having a ground voltage into a converted multiplexing signal having a first negative voltage. The row decoder is configured to select at least one of the word lines in response to the converted multiplexing signals and the selection line signals.

According to another embodiment, a nonvolatile memory device includes a first mat, a second mat, address buffers, a pre-decoder, a first row decoder, and a second row decoder. The first mat has first memory blocks and the second mat has second memory blocks. The address buffers are configured to generate first and second address signals. The pre-decoder includes a first multiplexer, a second multiplexer, first negative level shifters, and second negative level shifters. The first and second multiplexer are configured to generate first and second pre-decoding signals in response to the first and second address signals, respectively. Each of the first negative level shifters is configured to generate a first converted pre-decoding signal corresponding to a respective first pre-decoding signal by converting a first pre-decoding signal having a ground voltage into a first converted pre-decoding signal having a negative voltage. Each of the second negative level shifters is configured to generate a second level shifted pre-decoding signal corresponding to a respective second pre-decoding signal by converting a second pre-decoding signal having the ground voltage into a second converted pre-decoding signal having the negative voltage. The first row decoder is configured to select one of the first memory blocks in response to the first converted pre-decoding signals. The second row decoder is configured to select one of the second memory blocks in response to the second converted pre-decoding signals.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION OF THE EMBODIMENTS

Figure 1:
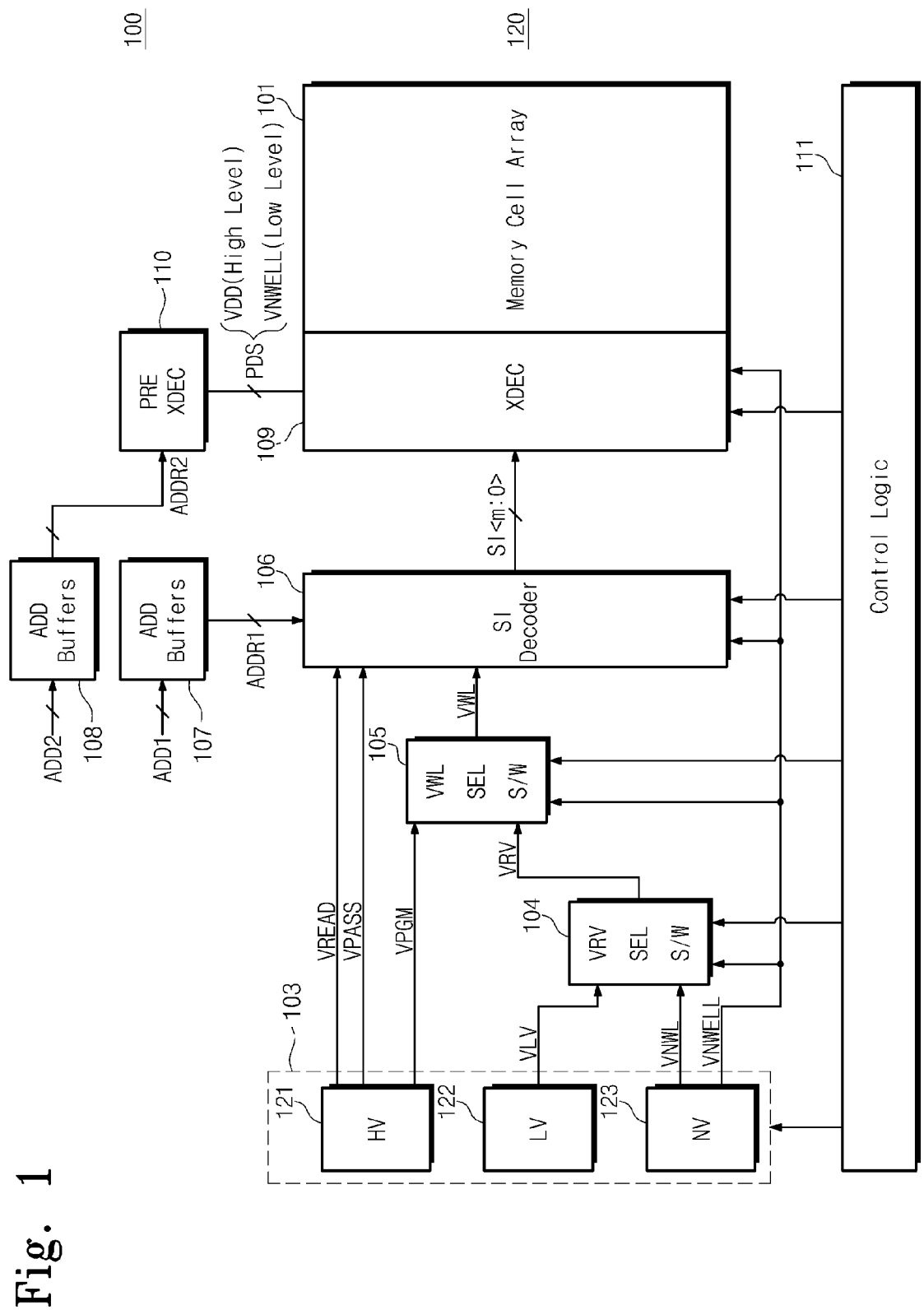
FIG. 1 is a block diagram schematically illustrating a nonvolatile memory device according to an exemplary embodiment.

Various example embodiments will be described more fully hereinafter with reference to the accompanying drawings, in which some example embodiments are shown. This present disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory device according to an exemplary embodiment of the present disclosure may be a NAND flash memory, a vertical NAND flash memory, a NOR flash memory, a Resistive Random Access Memory (RRAM), a Phase-change RAM (PRAM), a Magnetoresistive RAM (MRAM), a Ferroelectric RAM (FRAM), a Spin Transfer Torque RAM (STT-RAM), or the like. Further, the nonvolatile memory device according to an exemplary embodiment can be implemented to have a three-dimensional array structure. The present disclosure may be applicable to a flash memory device, in which a charge storage layer is formed of a conductive floating gate, and a charge trap flash (CTF) memory in which a charge storage layer is formed of an insulation film.

Below, for ease of description, a nonvolatile memory device 100 may be assumed to be a vertical NAND flash memory device (VNAND). In particular, a nonvolatile memory device to be described below may provide a negative voltage to a word line. A nonvolatile memory device supplying a negative voltage to a word line is disclosed in U.S. Patent Publication Nos. 2011-0051520 and 2011-0096602, the entirety of which is incorporated by reference herein.

FIG. 1 is a block diagram schematically illustrating a nonvolatile memory device according to an exemplary embodiment.

Referring to FIG. 1, a nonvolatile memory device 100 may include a memory cell array 101, a voltage generator circuit 103, a read verification voltage selecting switch circuit 104, a word line voltage selecting switch circuit 105, a selection line decoder 106, first address buffers 107, second address buffers 108, a row decoder 109, a pre-decoder 110, and control logic 111.

The memory cell array 101 may include a plurality of memory blocks (not shown). Each memory block may include a plurality of memory cells, each of which may store one or more bits of data.

The voltage generator circuit 103 may generate voltages necessary for an operation of the nonvolatile memory device 100. The voltage generator circuit 103 may include a high voltage generator 121, a low voltage generator 122, and a negative voltage generator 123.

The high voltage generator 121 may generate a high voltage VPP, an erase voltage VERS, a program voltage VPGM, a pass voltage VPASS, and/or a read pass voltage VREAD.

The low voltage generator 122 may generate a peri-voltage VLV. Herein, the peri-voltage may be higher than 0V and lower than the read pass voltage VREAD.

The negative voltage generator 123 may generate a negative voltage VNWL and a negative voltage for a well voltage VNWELL. The negative voltage VNWL may be supplied to a selected word line, and the negative voltage for a well voltage VNWELL may be supplied to a well where the negative voltage VNWL is supplied. Herein, the negative voltage for a well voltage VNWELL may be identical to or lower than the negative voltage VNWL.

The read verification voltage selecting switch circuit 104 may select one of the peri-voltage VLV and the negative voltage VNWL as a read verification voltage VRV. Herein, the read verification voltage VRV may be a read voltage or a verification voltage as a voltage associated with a read operation.

In an embodiment, when the negative voltage VNWL is provided to the read verification voltage selecting switch circuit 104, a well of the read verification voltage selecting switch circuit 104 may be supplied with the negative voltage for a well voltage VNWELL. When a positive voltage is provided to the read verification voltage selecting switch circuit 104, a well of the read verification voltage selecting switch circuit 104 may be supplied with a ground voltage (e.g., 0V).

The word line voltage selecting switch circuit 105 may select one of the program voltage VPGM and the read verification voltage VRV as a word line voltage VWL. In an embodiment, when the read verification voltage VRV is the negative voltage VNWL, a well including the word line voltage selecting switch circuit 105 may be supplied with the negative voltage for a well voltage VNWELL. That is, when a read voltage VR is the negative voltage VNWL or a verification voltage VF is the negative voltage VNWL, a well of the word line voltage selecting switch circuit 105 may be supplied with the negative voltage for a well voltage VNWELL.

The first address buffers 107 include a plurality of address buffers and are configured to receive address input signals ADD1, and to output address output signals ADDR1. The second address buffers 108 include a plurality of address buffers and are configured to receive address input signals ADD2, and to output address output signals ADDR2. Each of the address input signals ADD1 and ADD2 may be received from an external terminal of the nonvolatile memory device.

The selection line decoder 106 may receive the address output signals ADDR1 and one of the pass voltage VPASS and the read pass voltage VREAD or the word line voltage VWL to provide it to corresponding selection lines SI<m:0> (m being a natural number). In an embodiment, when the word line voltage VWL is the negative voltage VNWL, a well of the selection line decoder 106 may be supplied with the negative voltage for a well voltage VNWELL.

The row decoder 109 may select one of the plurality of memory blocks in response to pre-decoding signals PDS.

The row decoder 109 may transfer bias voltages provided from the plurality of selection lines SI<m:0> into corresponding word lines of a selected memory block. Herein, the bias voltages may include a program voltage VPGM, a read voltage VR, a verification voltage VF, a pass voltage VPASS, a read pass voltage VREAD, an erase voltage VERS, etc.

In an embodiment, when one of the bias voltages is the negative voltage VNWL, a well of the row decoder 109 may be supplied with the negative voltage for a well voltage VNWELL.

The pre-decoder 110 may decode the address signals ADDR2 to generate pre-decoding signals PDS. Herein, each of the pre-decoding signals PDS may have a high level of a power supply voltage VDD or a low level of the negative voltage VNWELL. In an embodiment, the pre-decoder 110 may be disposed at a peri region other than a memory core region 120 (the memory core region being, for example, a region including the memory cell array 101 and the row decoder 109).

In an embodiment, the pre-decoder 110 may be configured to convert a signal of a ground voltage (0V) into a signal of a negative voltage, and as such, may perform a negative level shift operation.

The control logic 111 may control an overall operation of the nonvolatile memory device 100. The control logic 111 may control the above-described elements 103, 104, 105, 106, 109, and 110 in response to control signals and a command provided from an external device.

The nonvolatile memory device 100 of the present disclosure may be configured to provide a selected word line with the negative voltage VNWL of the negative voltage generator 123 via the read verification voltage selecting switch circuit 104, the word line voltage selecting switch circuit 105, and the selection line decoder 106. Further, the nonvolatile memory device 100 of the present disclosure may be configured to provide the negative voltage VNWELL to a well where circuits supplied with the negative voltage are formed.

A nonvolatile memory device disclosed in the above-mentioned reference (U.S. Patent Publication No. 2011-0051520) may be configured such that a negative level shift operation is performed at a row decoder of a memory core region, while the nonvolatile memory device 100 of the present disclosure may be configured such that a negative level shift operation is performed at the pre-decoder 110 of a peri region. Since a negative level shift is not located at a row decoder 109 of a memory core, a region of the memory core may be secured as much as that. That is, the integrity of the nonvolatile memory device 100 may be improved.

Figure 2:
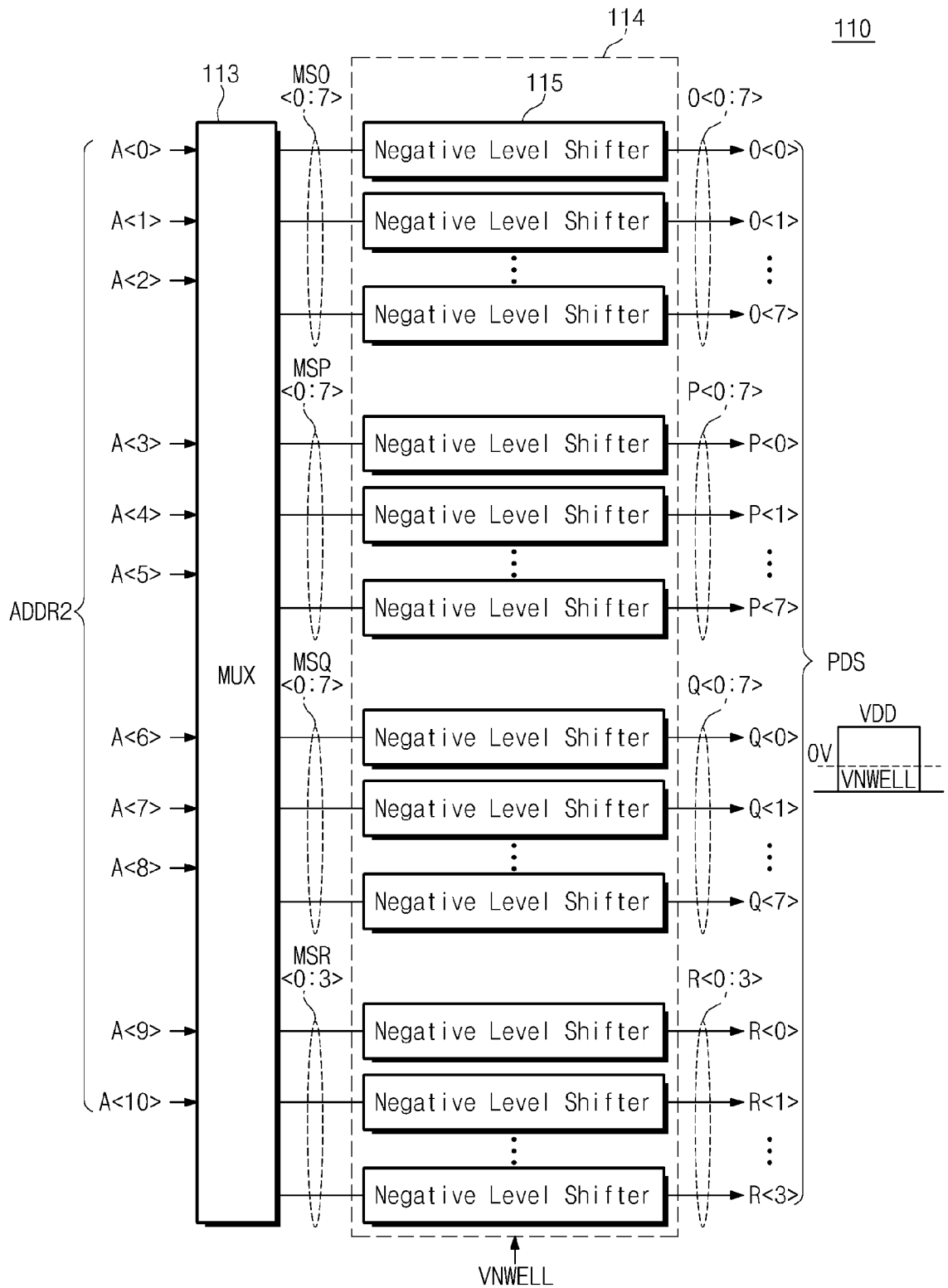
FIG. 2 is a block diagram schematically illustrating a pre-decoder illustrated in FIG. 1 according to example embodiments.

FIG. 2 is a block diagram schematically illustrating the pre-decoder illustrated in FIG. 1 according to example embodiments. Referring to FIG. 2, the pre-decoder 110 may include a multiplexer 113 and a plurality of level shifters 114.

The multiplexer 113 may multiplex the address output signals ADDR2 (A<0:10>) to generate grouped multiplexing signals MSO<0:7>, MSP<0:7>, MSQ<0:7>, and MSR<0:3>. Each of the address output signals ADDR2 (A<0:10>) may include a normal and a complementary address signals. For example, first set of the address output signals ADDR2, A<0>, A<1>, and A<2> may be multiplexed to multiplexing signals MSO<0:7>, second set of the address output signals ADDR2, A<3>, A<4>, and A<5> may be multiplexed to multiplexing signals MSP<0:7>, third set of the address output signals ADDR2, A<6>, A<7>, and A<8> may be multiplexed to multiplexing signals MSQ<0:7>, and the remaining set of the address output signals ADDR2, A<9> and A<10> may be multiplexed to multiplexing signals MSR<0:3>.

The address output signals ADDR2 provided to the multiplexer 113 may be an 11-bit address. However, the present disclosure is not limited thereto. Further and detailed description of a multiplexer such as multiplexer 113 is disclosed in U.S. Pat. No. 6,724,682, the entirety of which is incorporated by reference herein.

The negative level shifters 114 may generate pre-decoding signals PDS (O<0:7>, P<0:7>, Q<0:7>, and R<0:3>) by making negative level shifting on the multiplexing signals MSO<0:7>, MSP<0:7>, MSQ<0:7>, and MSR<0:3>. Herein, each of the pre-decoding signals O<0:7>, P<0:7>, Q<0:7>, and R<0:3> may have a high level of a power supply voltage VDD or a low level of a negative voltage VNWELL. Each pre-decoding signal may be a converted multiplexing signal that corresponds to a multiplexing signal received at a negative level shifter. Also, each pre-decoding signal may be referred to as a converted pre-decoding signal or a level shifted pre-decoding signal. For example, a level shifter 115 may generate a pre-decoding signal O<0> having the negative voltage VNWELL in response to a multiplexing signal MSO<0> having a voltage of 0V.

In an embodiment, the number of negative level shifters may correspond to the number of pre-decoding signals MSO<0:7>, MSP<0:7>, MSQ<0:7>, and MSR<0:3>.

In an embodiment, the negative voltage VNWELL may be provided to a well of the negative level shifters 114.

The pre-decoder 110 may generate pre-decoding signals PDS having a power supply voltage VDD or a negative voltage VNWELL.

Figure 3A:
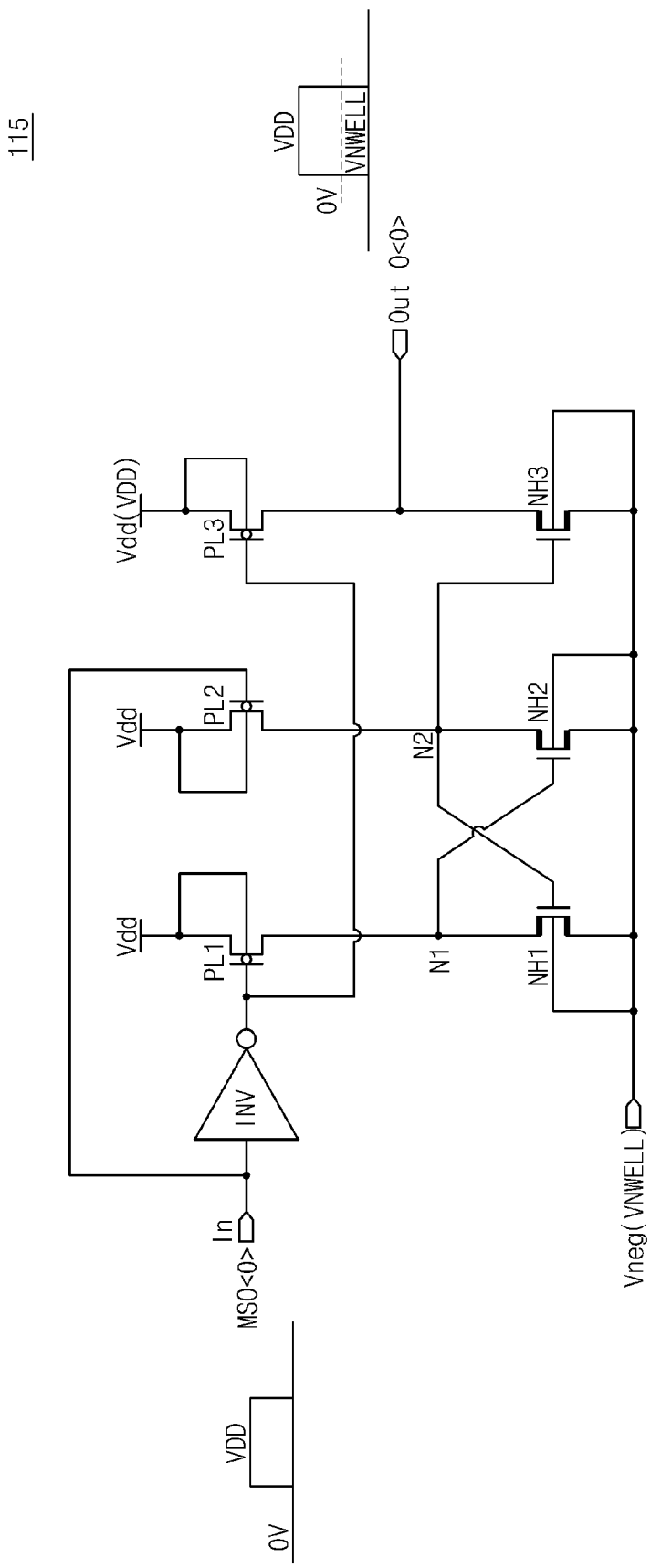
FIGS. 3A and 3B are circuit diagrams exemplarily illustrating a negative level shifter illustrated in FIG. 2 according to example embodiments.

FIG. 3A is a circuit diagram exemplarily illustrating a negative level shifter illustrated in FIG. 2 according to example embodiments. Referring to FIG. 3A, a negative level shifter 115 may include inverter INV, first to third PMOS transistors for a low voltage PL1, PL2 and PL3, and first to third NMOS transistors for a high voltage NH1, NH2, and NH3.

The inverter INV may be connected to an input terminal In, and may invert a multiplexing signal MSO<0> input via the input terminal In.

The first PMOS transistor PL1 and the first NMOS transistor NH1 may be connected in series between a power supply terminal Vdd and a well voltage terminal Vneg, and the second PMOS transistor PL2 and the second NMOS transistor NH2 may be connected in series between the power supply terminal Vdd and the well voltage terminal Vneg. The PMOS transistor PL3 and the third NMOS transistor NH3 may be connected in series between the power supply terminal Vdd and the well voltage terminal Vneg. Herein, a power supply voltage VDD may be supplied to the power supply terminal Vdd and a negative voltage VNWELL may be supplied to the well voltage terminal Vneg.

A gate of the first PMOS transistor PL1 may be connected with an output of the inverter INV, a gate of the second PMOS transistor PL2 may be connected with the input terminal In, and a gate of the PMOS transistor PL3 may be connected with an output of the inverter INV. A body of each of the first and second PMOS transistors PL1, PL2 and PL3 may be connected with a corresponding source. In one embodiment, the body of each of the PMOS transistors PL1, PL2 and PL3 includes an n-type channel region of a respective transistor.

A gate of the first NMOS transistor NH1 may be connected with a second node N2, a gate of the second NMOS transistor NH2 may be connected with the first node N1, and a gate of the third NMOS transistor NH3 may be connected with the second node N2. A body of each of the first to third NMOS transistors NH1 to NM3 may be connected with a corresponding source. That is, bodies of the first to third NMOS transistors NH1 to NH3 may be connected with the well voltage terminal Vneg. In one embodiment, the body of each of the NMOS transistors NH1, NH2 and NH3 includes a p-type channel region of a respective transistor.

Below, an operation of the negative level shifter 115 will be described.

In one example, it is assumed that the multiplexing signal MSO<0> having a power supply voltage VDD is input to an input terminal In and the negative voltage VNWELL is input to the well voltage terminal Vneg. The multiplexing signal MSO<0> having the power supply voltage VDD may be inverted to an inversion signal having 0V via the inverter INV. Since 0V is applied to a gate of the third PMOS transistor PL3, the third PMOS transistor PL3 may be turned on. As a result, a pre-decoding signal O<0> having the power supply voltage VDD may be output as the converted multiplexing signal via an output terminal Out.

In another example, it is assumed that the multiplexing signal MSO<0> having 0V is input to the input terminal In and the negative voltage VNWELL is input to the well voltage terminal Vneg. The multiplexing signal MSO<0> having 0V may be inverted to an inversion signal having the power supply voltage VDD via the inverter INV. Since the power supply voltage VDD is applied to a gate of the first PMOS transistor PL1, the first PMOS transistor PL1 may be turned off. Since 0V is applied to a gate of the second PMOS transistor PL2, the second PMOS transistor PL2 may be turned on. Accordingly, the second node N2 may have the power supply voltage VDD. This may make the third NMOS transistor NH3 be turned on. As a result, a pre-decoding signal O<0> having the negative voltage VNWELL may be output as the converted multiplexing signal via the output terminal Out. Because the level of the multiplexing signal is converted from 0V to a negative voltage, the converted multiplexing signal is a level shifted multiplexing signal, also referred to as a level shifted pre-decoding signal.

In FIG. 3A, the negative level shifter 115 may include a pull-up circuit formed of the PMOS transistors PL1 and PL2. However, the present disclosure is not limited thereto. The pull-up circuit of the negative level shifter can be implemented by at least one transistor for a low voltage or at least one transistor for a high voltage.

The negative level shifter 115 according to an exemplary embodiment may convert a multiplexing signal MSO<0> having a ground voltage into a pre-decoding signal O<0> having a negative voltage VNWELL.

Figure 3B:
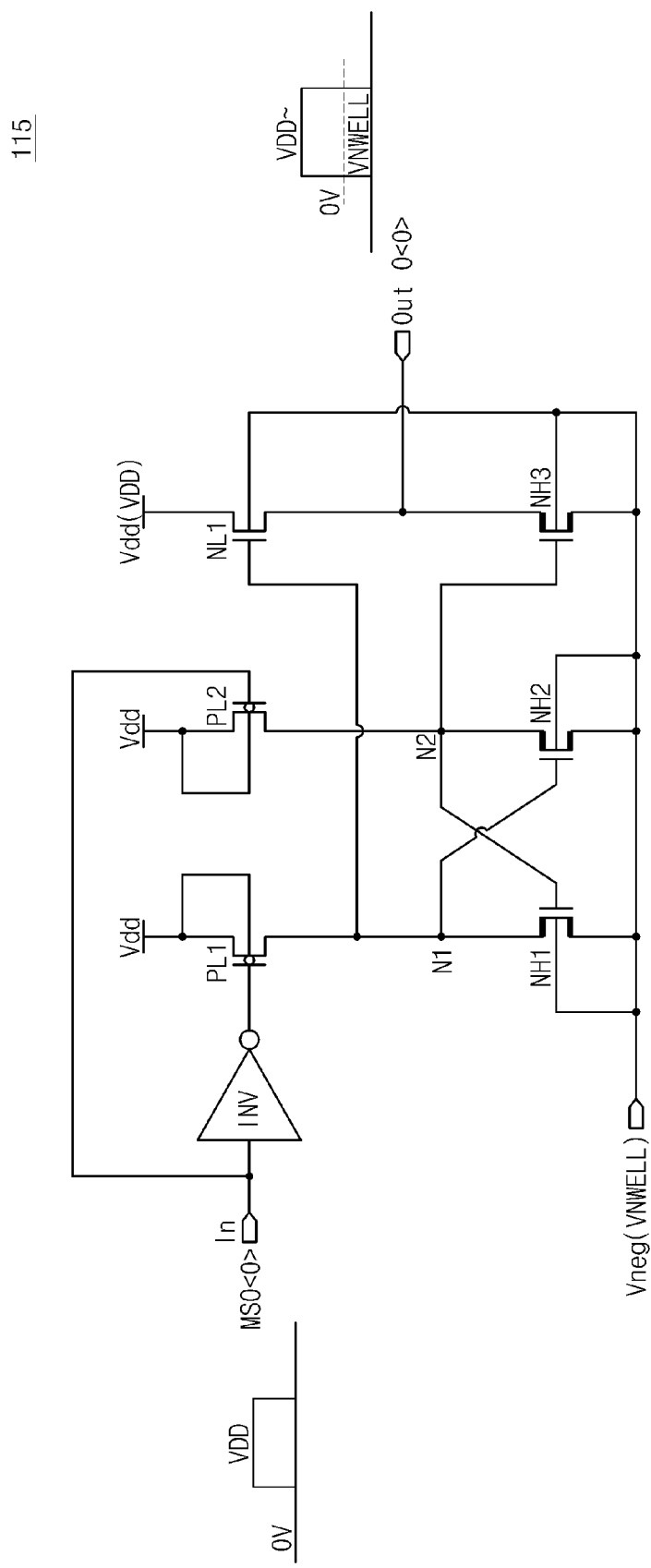

FIG. 3B is another diagram exemplarily illustrating a negative level shifter illustrated in FIG. 2. Referring to FIG. 3B, a negative level shifter 115 may include an inverter INV, first and second PMOS transistors for a low voltage PL1 and PL2, an NMOS transistor NL1, and first to third NMOS transistors for a high voltage NH1, NH2, and NH3.

The inverter INV may be connected with an input terminal In, and may invert a multiplexing signal MSO<0> input via the input terminal In.

The first PMOS transistor PL1 and the first NMOS transistor NH1 may be connected in series between a power supply terminal Vdd and a well voltage terminal Vneg, and the second PMOS transistor PL2 and the second NMOS transistor NH2 may be connected in series between the power supply terminal Vdd and the well voltage terminal Vneg. The NMOS transistor NL1 and the third NMOS transistor NH3 may be connected in series between the power supply terminal Vdd and the well voltage terminal Vneg. Herein, a power supply voltage VDD may be supplied to the power supply terminal Vdd and a negative voltage NWELL may be supplied to the well voltage terminal Vneg.

A gate of the first PMOS transistor PL1 may be connected with an output of the inverter INV, a gate of the second PMOS transistor PL2 may be connected with the input terminal In, and a gate of the NMOS transistor NL1 may be connected with a first node N1. A body of each of the first and second PMOS transistors PL1 and PL2 may be connected with a corresponding source. A body of the NMOS transistor NL1 may be connected with a corresponding source. In an embodiment, the NMOS transistor NL1 may be a transistor for a high voltage.

A gate of the first NMOS transistor NH1 may be connected with a second node N2, a gate of the second NMOS transistor NH2 may be connected with the first node N1, and a gate of the third NMOS transistor NH3 may be connected with the second node N2. A body of each of the first to third NMOS transistors NH1 to NM3 may be connected with a corresponding source. That is, bodies of the first to third NMOS transistors NH1 to NH3 may be connected with the well voltage terminal Vneg.

Below, an operation of the negative level shifter 115 will be described.

It is assumed that the multiplexing signal MS0<0> having a power supply voltage VDD is input to an input terminal In and the negative voltage NWELL is input to the well voltage terminal Vneg. The multiplexing signal MS0<0> having the power supply voltage VDD may be inverted to an inversion signal having 0V via the inverter INV. Since 0V is applied to a gate of the first PMOS transistor PL1, the first PMOS transistor PL1 may be turned on. Since the power supply voltage VDD is applied to a gate of the second PMOS transistor PL2, the second PMOS transistor PL2 may be turned off. Accordingly, the first node N1 may have the power supply voltage VDD. This may make the NMOS transistor NL1 be turned on. As a result, a pre-decoding signal O<0> having about the power supply voltage VDD~ (e.g.,VDD-Vth) may be output via an output terminal Out.

It is assumed that the multiplexing signal MS0<0> having 0V is input to the input terminal In and the negative voltage NWELL is input to the well voltage terminal Vneg. The multiplexing signal MS0<0> having 0V may be inverted to an inversion signal having the power supply voltage VDD via the inverter INV. Since the power supply voltage VDD is applied to a gate of the first PMOS transistor PL1, the first PMOS transistor PL1 may be turned off. Since 0V is applied to a gate of the second PMOS transistor PL2, the second PMOS transistor PL2 may be turned on. Accordingly, the second node N2 may have the power supply voltage VDD. This may make the third NMOS transistor NH3 be turned on. As a result, a pre-decoding signal O<0> having the negative voltage NWELL may be output via the output terminal Out.

Figure 4:
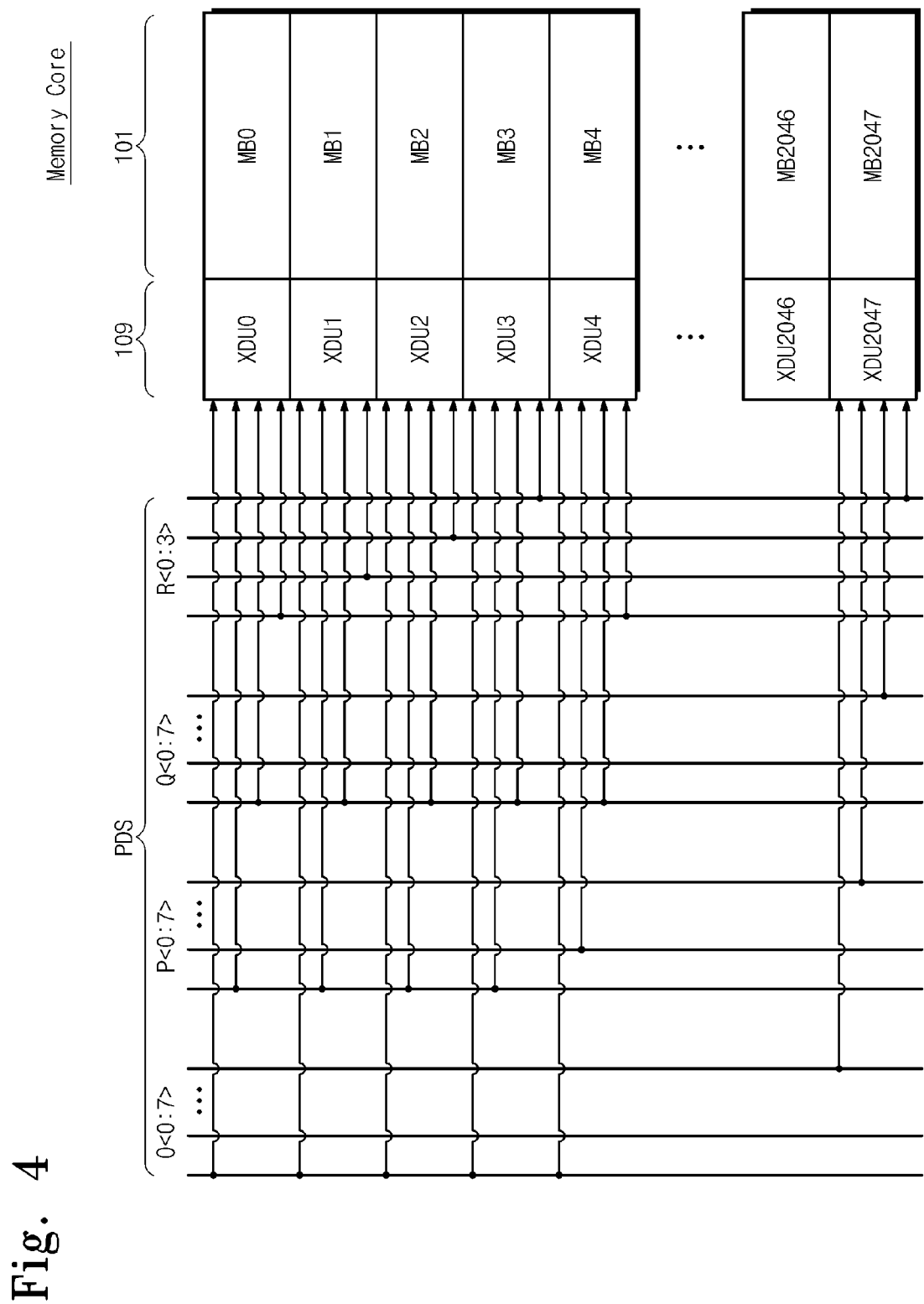
FIG. 4 is a diagram illustrating pre-decoding signals being provided to a row decoder according to example embodiments.

FIG. 4 is a diagram illustrating pre-decoding signals being provided to a row decoder according to example embodiments. It is assumed that a row decoder 109 (refer to FIG. 1) includes 2048 (8×8×8×4) decoding units XDU0 to XDU2047 and a memory cell array 101 (refer to FIG. 1) includes memory blocks MB0 to MB2047 selected by the decoding units XDU0 to XDU2047, respectively. However, the present disclosure is not limited thereto.

Referring to FIG. 4, each of the decoding units XDU0 to XDU2047 may receive one of pre-decoding signals O<O:7>, one of pre-decoding signals P<O:7>, one of pre-decoding signals Q<O:7>, and one of pre-decoding signals R<O:7>. Although not shown in FIG. 4, each of the decoding units XDU0 to XDU2047 may combine input pre-decoding signals O, P, Q, and R to select a corresponding memory block.

A nonvolatile memory device 100 according to an exemplary embodiment of the present disclosure may be configured to perform a negative level shifting operation at a pre-decoder 110 of a peri region. That is, a negative level shifting operation may not be performed at a row decoder 109 of a memory core. This may mean that an area of the memory core is further secured.

In case of a nonvolatile memory device disclosed in the above-mentioned reference (U.S. Patent Publication No. 2011-0051520), the number of signals (e.g., the number of negative level shifters) for performing a negative level shifting operation may be identical to the number of decoding units (e.g., 2048). On the other hand, in case of the inventive concept, the number of signals (e.g., the number of negative level shifters) for performing a negative level shifting operation may be identical to the number of pre-decoding signals (e.g., 28). Accordingly, it is possible to remarkably improve the integrity as compared with the nonvolatile memory device disclosed in the above-mentioned reference (U.S. Patent Publication No. 2011-0051520).

Figure 5:
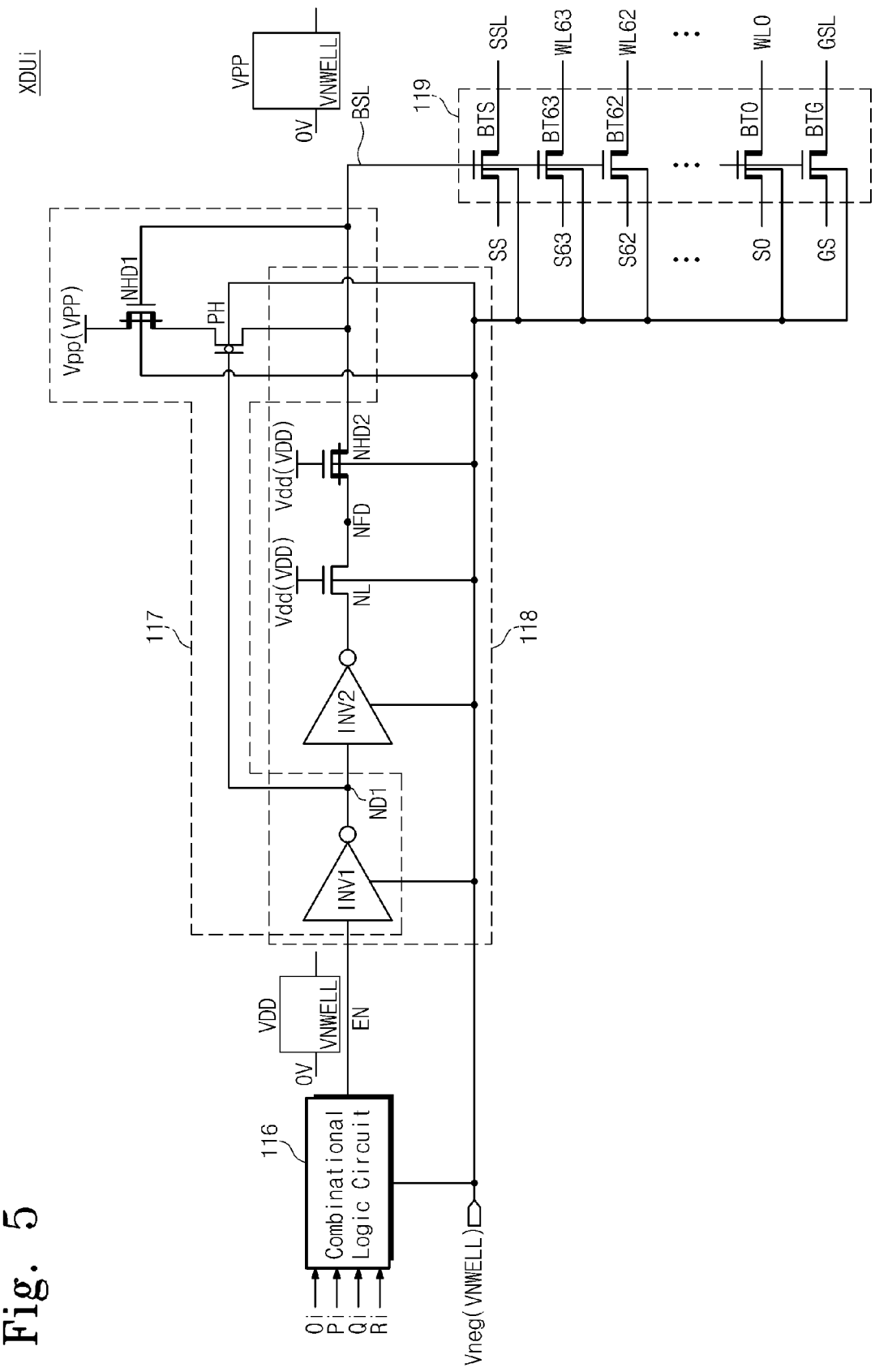
FIG. 5 is a diagram illustrating a decoding unit illustrated in FIG. 4 according to example embodiments.

FIG. 5 is a diagram illustrating a decoding unit illustrated in FIG. 4 according to example embodiments. Referring to FIG. 5, a decoding unit XDUi (i being one of 0 to 2047) may include a combinational logic circuit 116, a pull-up circuit 117, a pull-down circuit 118, and a voltage transfer circuit 119.

The combinational logic circuit 116 may combine pre-decoding signals Oi, Pi, Qi, and Ri input to the decoding unit XDUi to generate a voltage transfer enable signal EN. Herein, the voltage transfer enable signal EN may have a high level of a power supply voltage VDD or a low level of a negative voltage VNWELL.

In an embodiment, the voltage transfer enable signal EN may be determined by a combination of the pre-decoding signals Oi, Pi, Qi, and Ri and at least one control signal (e.g., a discharge signal) other than the pre-decoding signals Oi, Pi, Qi, and Ri.

In an embodiment, a well of the combinational logic circuit 116 may be connected with a negative voltage terminal Vneg. In particular, bodies of transistors of the combinational logic circuit 116 may be connected with the negative voltage terminal Vneg.

The pull-up circuit 117 may be connected between a high voltage VPP and a block selection line BSL, and may provide the high voltage VPP to the block selection line BSL in response to the voltage transfer enable signal EN.

The pull-up circuit 117 may include a first depletion transistor NHD1, a PMOS transistor for a high voltage PH, and a first inverter INV1.

The first depletion transistor NHD1 may have a drain connected with the high voltage VPP and a gate connected with the block selection line BSL.

The PMOS transistor PH may have a source connected with a source of the depletion transistor NHD1, a drain connected with the block selection line BSL, and a gate connected with a node ND1.

The first inverter INV1 may invert the voltage transfer enable signal EN. An output of the first inverter INV1 may be connected with the node ND1.

In an embodiment, bodies of the first depletion transistor NHD1, the PMOS transistor PH, an NMOS transistor of the first inverter INV1 may be connected with the negative voltage terminal Vneg.

The pull-up circuit 117 may provide the high voltage VPP to the block selection line BSL in response to the voltage transfer enable signal EN having a high level. Providing of the high voltage VPP to the block selection line BSL may be made as follows. If the voltage transfer enable signal EN having a high level is received, the first inverter INV1 may output a low-level signal. The PMOS transistor PH may be turned on by the low-level signal from the first inverter INV1. It is assumed that an initial level of the block selection line BSL is 0V. Accordingly, the first depletion transistor NHD1 may provide a threshold voltage (e.g., about 2V) of the first depletion transistor NHD1 to the block selection line in response to a gate voltage of 0V. This may enable a voltage of the block selection line BSL to increase. At the same time, an increased voltage of the block selection line BSL may be fed back to a gate of the first depletion transistor NHD1. As a gate voltage of the first depletion transistor NHD1 increases, a voltage of the block selection line BSL may increase. The first depletion transistor NHD1 may prevent a voltage of the block selection line BSL from increasing sharply. A voltage of the block selection line BSL may increase up to the high voltage VPP via iteration of the above-described operation.

If the voltage transfer enable signal EN having a low level is received, the first inverter INV1 may output a high-level signal. The PMOS transistor PH may be turned off by the high-level signal from the first inverter INV1. This may make the pull-up circuit 117 be electrically separated from the block selection line BSL.

The pull-down circuit 118 may provide a low level (e.g., a negative voltage VNWELL) of the voltage transfer enable signal EN to the block selection line BSL in response to the voltage transfer enable signal EN.

The pull-down circuit 118 may include a second depletion transistor NHD2, an NMOS transistor for a low voltage NL, and first and second inverters INV1 and INV2.

In an embodiment, bodies of the second depletion transistor NHD2, the NMOS transistor NL, and NMOS transistors of the first and second inverters INV1 and INV2 may be electrically connected with the negative voltage terminal Vneg.

The second depletion transistor NHD2 may be connected between the block selection line BSL and a shut-off node NFD, and may separate the pull-down circuit 118 from the block selection line BSL in response to the voltage transfer enable signal EN having a high level. The second depletion transistor NHD2 may connect the pull-down circuit 118 with the block selection line BSL in response to the voltage transfer enable signal EN having a low voltage.

Separating of the pull-down circuit 118 from the block selection line BSL according to the voltage transfer enable signal EN having a high level may be made as follows. The first inverter INV1 may output a low-level signal in response to the voltage transfer enable signal EN having a high level. The second inverter INV2 may output a high-level signal in response to the low-level signal from the first inverter INV1. Herein, the high-level signal may have a power supply voltage VDD. In this case, the transistor for a low voltage NL may be shut off from an output of the second inverter INV2. As a result, the pull-down circuit 118 may be separated from the block selection line BSL in response to the voltage transfer enable signal EN having a high voltage.

The second depletion transistor NHD2 may prevent a high voltage VPP of the block selection line BSL from be discharged sharply at a discharge operation.

Separating of the pull-down circuit 118 from the block selection line BSL according to the voltage transfer enable signal EN having a low level may be made as follows. If the voltage transfer enable signal EN having a low level is received, the first inverter INV1 may output a high-level signal, and the second inverter INV2 may output a low-level signal in response to a high-level signal from the first inverter INV1. Herein, the low-level signal may have a negative voltage VNWELL. The negative voltage VNWELL may be provided to the block selection line BSL via the transistor for a low voltage NL and the second depletion transistor NHD2.

The voltage transfer circuit 119 may connect selection lines S0 to S63, a string line SS, and a ground line GS with word lines WL0 to WL63, a string selection line SSL, and a ground selection line GSL in response to the high voltage VPP provided from the block selection line BSL, respectively. Although not shown in FIG. 5, a plurality of memory blocks (refer to FIG. 4, MB0 to MB2047) may share the selection lines SS, GS, and S0 to S63. Herein the number of word lines is not limited to 64.

The voltage transfer circuit 119 may include a plurality of block selection transistors BTS, BT0 to BT63, and BTG. Gates of the block selection transistors BTS, BT0 to BT63, and BTG may be connected in common with the block selection line BSL. In an embodiment, bodies of the block selection transistors BTS, BT0 to BT63, and BTG may be connected with the negative voltage terminal Vneg.

The decoding unit XDUi according to an exemplary embodiment need not require a negative level shifting operation by providing the high voltage VPP or the negative voltage VNWELL to the block selection line BSL in response to the voltage transfer enable signal EN generated by a combination of pre-decoding signals Oi, Pi, Qi, and Ri and transferring a low level, having the negative voltage VNWELL, of one of the pre-decoding signals Oi, Pi, Qi, and Ri to the block selection line BSL without modification.

Figure 6:
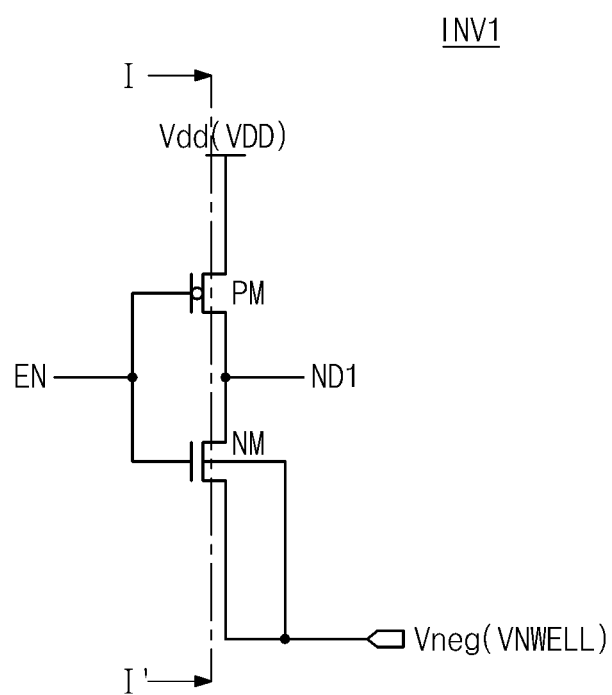
FIG. 6 is a circuit diagram illustrating a first inverter illustrated in FIG. 5 according to example embodiments.

FIG. 6 is a circuit diagram illustrating a first inverter illustrated in FIG. 5 according to example embodiments. Referring to FIG. 5, a first inverter INV1 may include a PMOS transistor PM and an NMOS transistor NM which are connected in series. The PMOS transistor PM may have a source connected with a power supply terminal Vdd and a gate connected to receive a voltage transfer enable signal EN. The NMOS transistor NM may have a source connected with a negative voltage terminal Vneg and a gate connected to receive the voltage transfer enable signal EN. Herein, a body of the NMOS transistor NM may be connected with the negative voltage terminal Vneg. The first inverter INV1 may invert the voltage transfer enable signal EN to output it to a node ND1.

Figure 7:
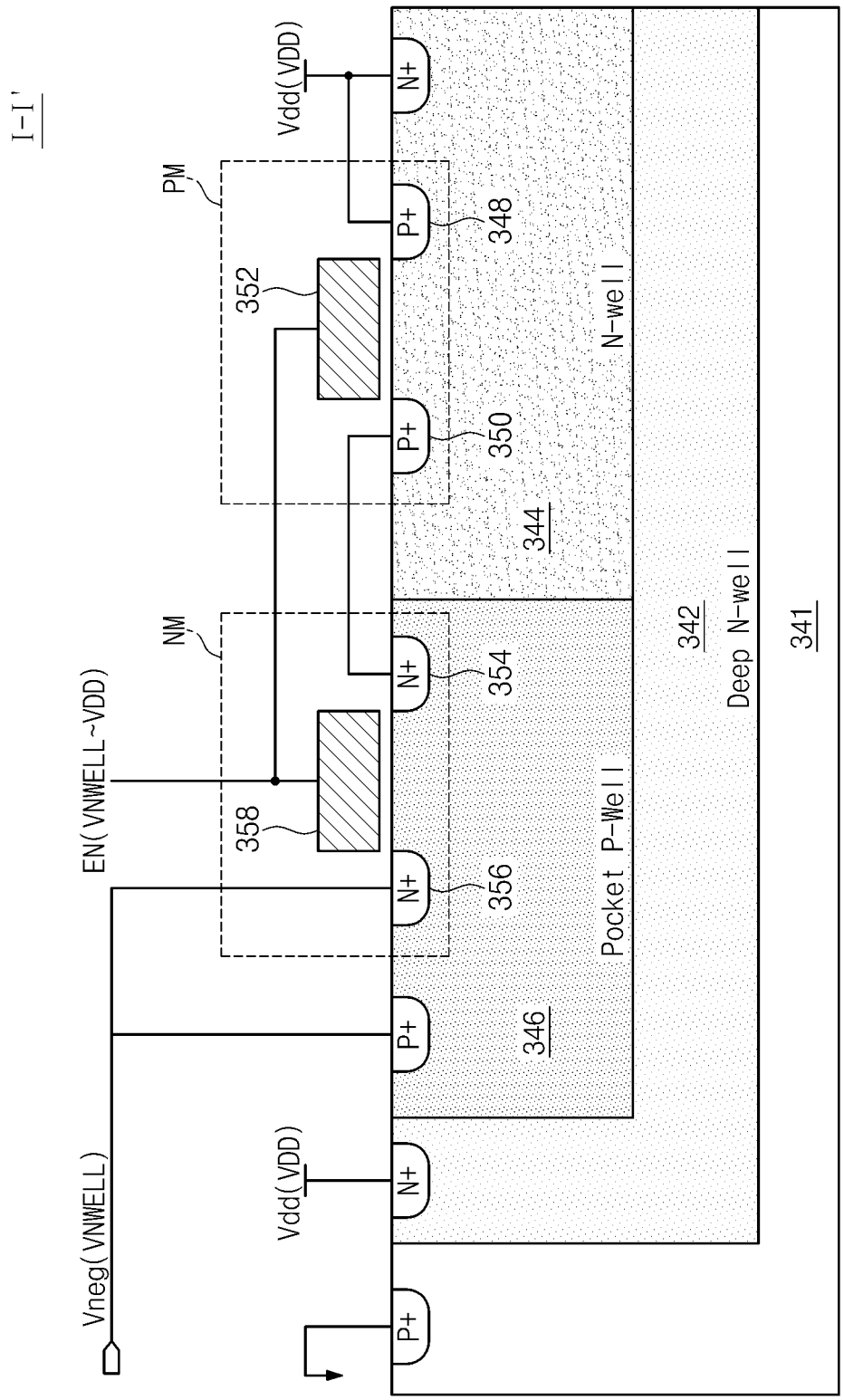
FIG. 7 is a cross sectional view of an inverter taken along a line I-I' illustrated in FIG. 6 according to example embodiments.

FIG. 7 is a cross sectional view of an inverter taken along a line I-I' illustrated in FIG. 6 according to example embodiments. Referring to FIG. 7, an inverter INV1 may be formed at a deep n-well 342 of a semiconductor substrate 341. The deep n-well 342 may be formed to surround an n-well 344, in which a PMOS transistor PM is formed, and a p-well 346 in which an NMOS transistor NM is formed. Herein, the deep n-well 342 may be supplied with a power supply voltage VDD to prevent a well diode forward bias from be forced between the p-well 346 and the n-well 342. If the well diode forward bias is forced between the p-well 346 and the n-well 342, a power may be consumed due to a DC path.

A first p-type doping region 348 corresponding to a source supplied with the power supply voltage VDD and a second p-type doping region 350 corresponding to a drain may be formed at the n-well 344. A gate of the PMOS transistor PM may be formed between the first p-type doping region 348 and the second p-type doping region 350. Herein, the first p-type doping region 348 and the n-well 344 may be supplied with the power supply voltage VDD.

A first n-type doping region 354 corresponding to a drain connected with the second p-type doping region 350 of the PMOS transistor PM and a second n-type doping region 356 corresponding to a source supplied with a negative voltage VNWELL may be formed at the p-well 346. A gate 358 of the NMOS transistor NM may be formed between the first n-type doping region 354 and the second n-type doping region 356. Herein, the second n-type doping region 356 and the p-well 346 may be connected with the negative voltage terminal Vneg. The negative voltage VNWELL may be supplied to the negative power terminal Vneg.

The gate 352 of the PMOS transistor PM and the gate 358 of the NMOS transistor NM may be interconnected to receive a voltage transfer enable signal EN. Herein, the voltage transfer enable signal EN may have a voltage between the negative voltage VNWELL and the power supply voltage VDD.

A nonvolatile memory device 100 according to an exemplary embodiment may adjust a voltage supplied to a well of a row decoder 109 and a timing of a pre-decoding signal PDS variously. FIGS. 8 to 11 are timing diagrams each illustrating a timing of a voltage supplied to a well of a row decoder 109 and a timing of a pre-decoding signal according to embodiments. Herein, a voltage supplied to a well may be a negative voltage VNWELL supplied to a negative voltage terminal Vneg.

Figure 8:
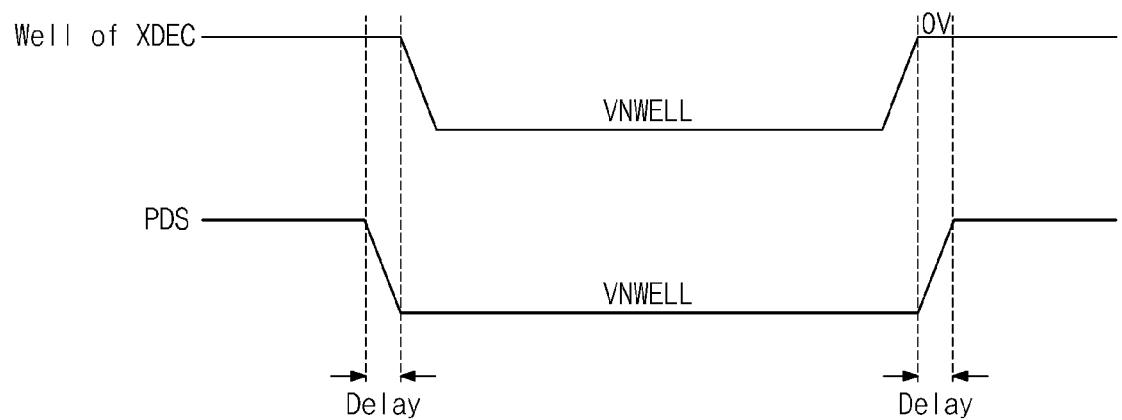
FIGS. 8 to 11 are timing diagrams each illustrating a timing of a voltage supplied to a well of a row decoder and a timing of a pre-decoding signal according to example embodiments.
Figure 9:
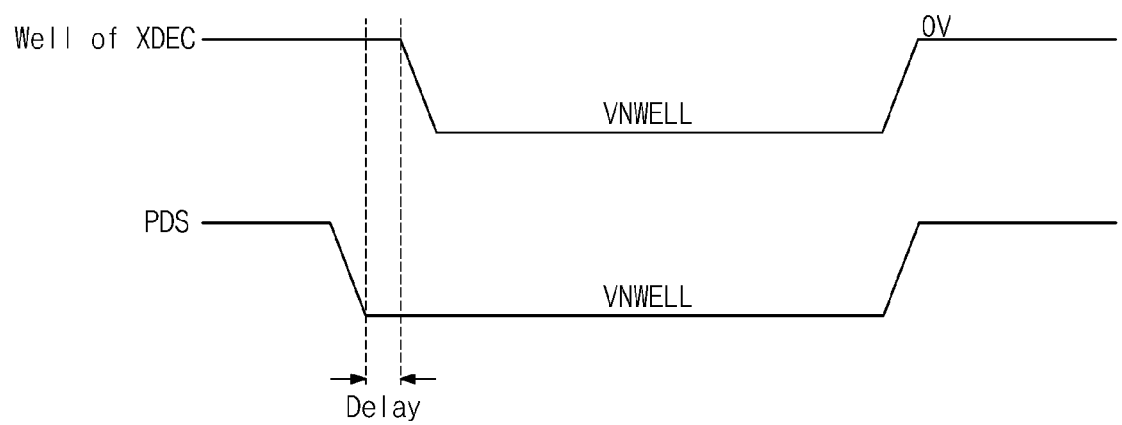
Figure 10:
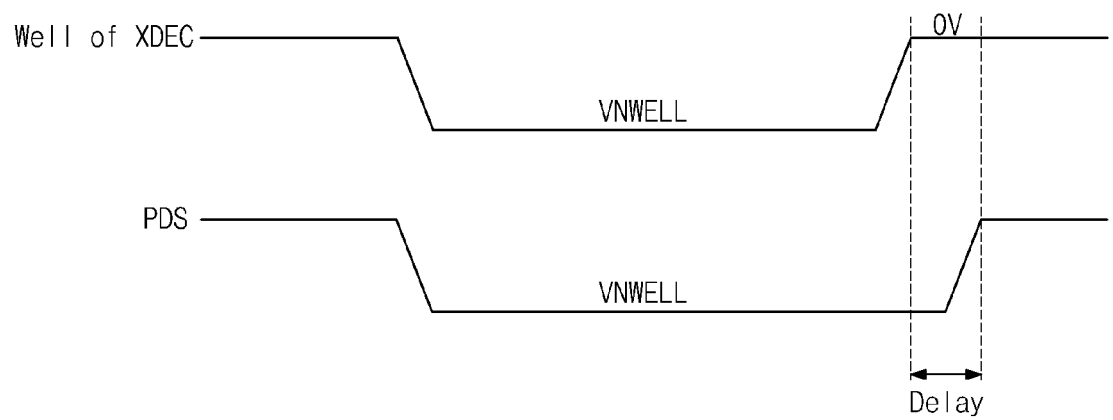
Figure 11:
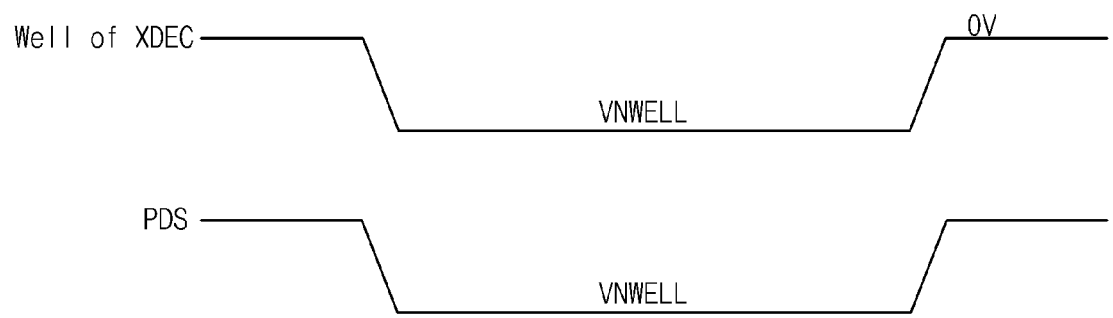

Referring to FIG. 8, after a voltage of a pre-decoding signal PDS is lowered to the negative voltage VNWELL and a delay time elapses, a well voltage of a row decoder 109 may be lowered to the negative voltage VNWELL. After a well voltage of the row decoder 109 is increased up to 0V and a delay time elapses, a voltage of the pre-decoding signal PDS may be increased to 0V. Herein, the delay time may be a time corresponding to a threshold voltage gap where a well diode forward bias is not generated. Referring to FIG. 9, after a voltage of the pre-decoding signal PDS is lowered to the negative voltage VNWELL and a delay time elapses, a well voltage of a row decoder 109 may be lowered to the negative voltage VNWELL. Increasing of the well voltage of the row decoder 109 and a voltage of the pre-decoding signal PDS to 0V may be made at the same time. Referring to FIG. 10, lowering of the well voltage of the row decoder 109 and a voltage of the pre-decoding signal PDS to the negative voltage VNWELL may be made at the same time. After a well voltage of the row decoder 109 is increased up to 0V and a delay time elapses, a voltage of the pre-decoding signal PDS may be increased to 0V. Referring to FIG. 11, lowering of the well voltage of the row decoder 109 and a voltage of the pre-decoding signal PDS to the negative voltage VNWELL may be made at the same time. Increasing of the well voltage of the row decoder 109 and a voltage of the pre-decoding signal PDS to 0V may be made at the same time.

Figure 12:
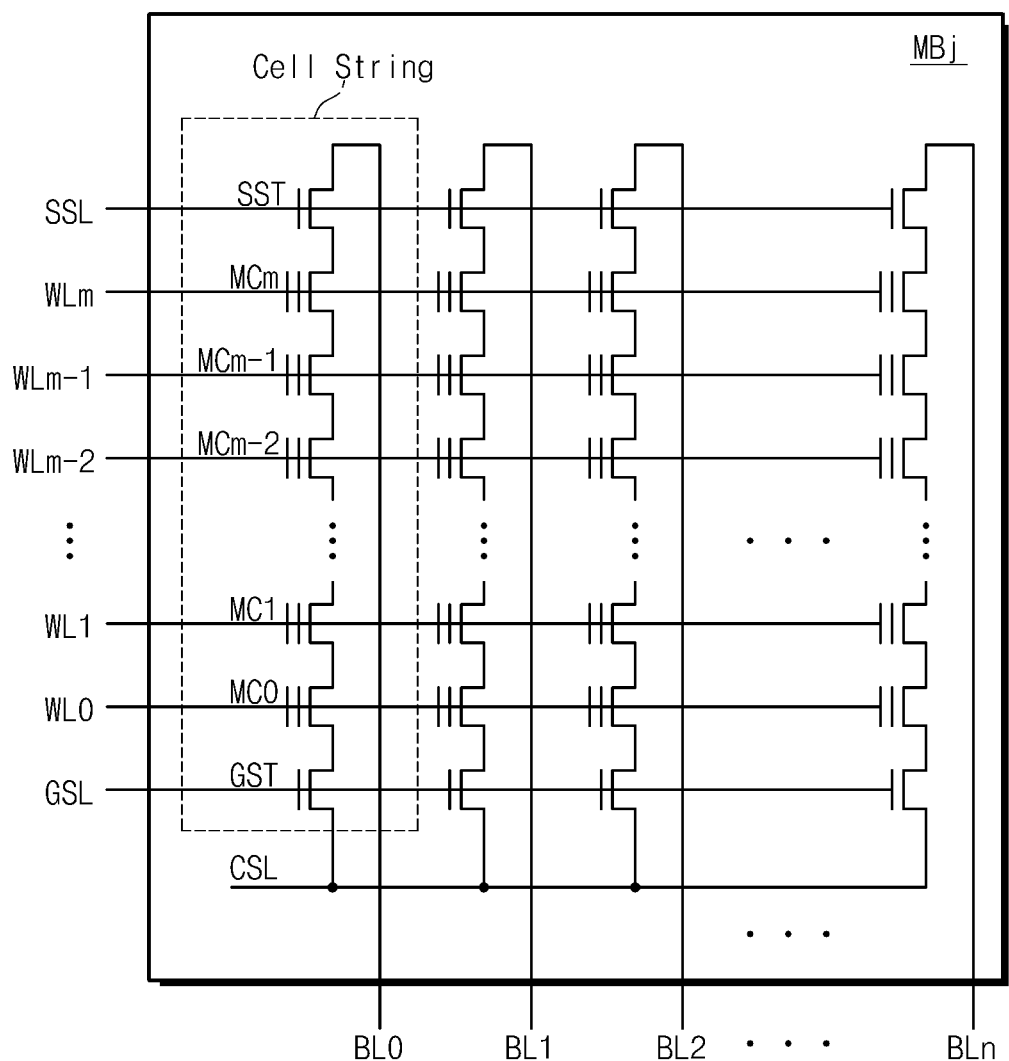
FIG. 12 is a circuit diagram illustrating one of memory blocks illustrated in FIG. 4 according to an exemplary embodiment.

FIG. 12 is a circuit diagram illustrating one of memory blocks illustrated in FIG. 4 according to an exemplary embodiment. Referring to FIG. 12, a memory block MBj (j being one of 0 to 2047) may include a plurality of cell strings. Each cell string may include a string selection transistor SST connected with a string selection line SSL, a plurality of memory cells MC0 to MCm (m being a natural number) connected with a plurality of word lines WL0 to WLm, respectively, and a ground selection transistor GST connected with a ground selection line GSL. Herein, the string selection transistors SST may be connected with bit lines BL0 to BLn, respectively, and the ground selection transistors GST may be connected with a common source line CSL. Herein, the common source line CSL may be supplied with a ground voltage or a CSL voltage (e.g., a power supply voltage) from a CSL driver (not shown).

Each of the plurality of memory cells MC0 to MCm may store 1-bit data or multi-bit data.

The memory block MBj illustrated in FIG. 12 may be implemented to have the all bit line architecture or the even-odd bit line architecture. Further and detailed description of the bit line architecture is disclosed in U.S. Pat. No. 7,379,333, the entirety of which is incorporated by reference herein.

Figure 13:
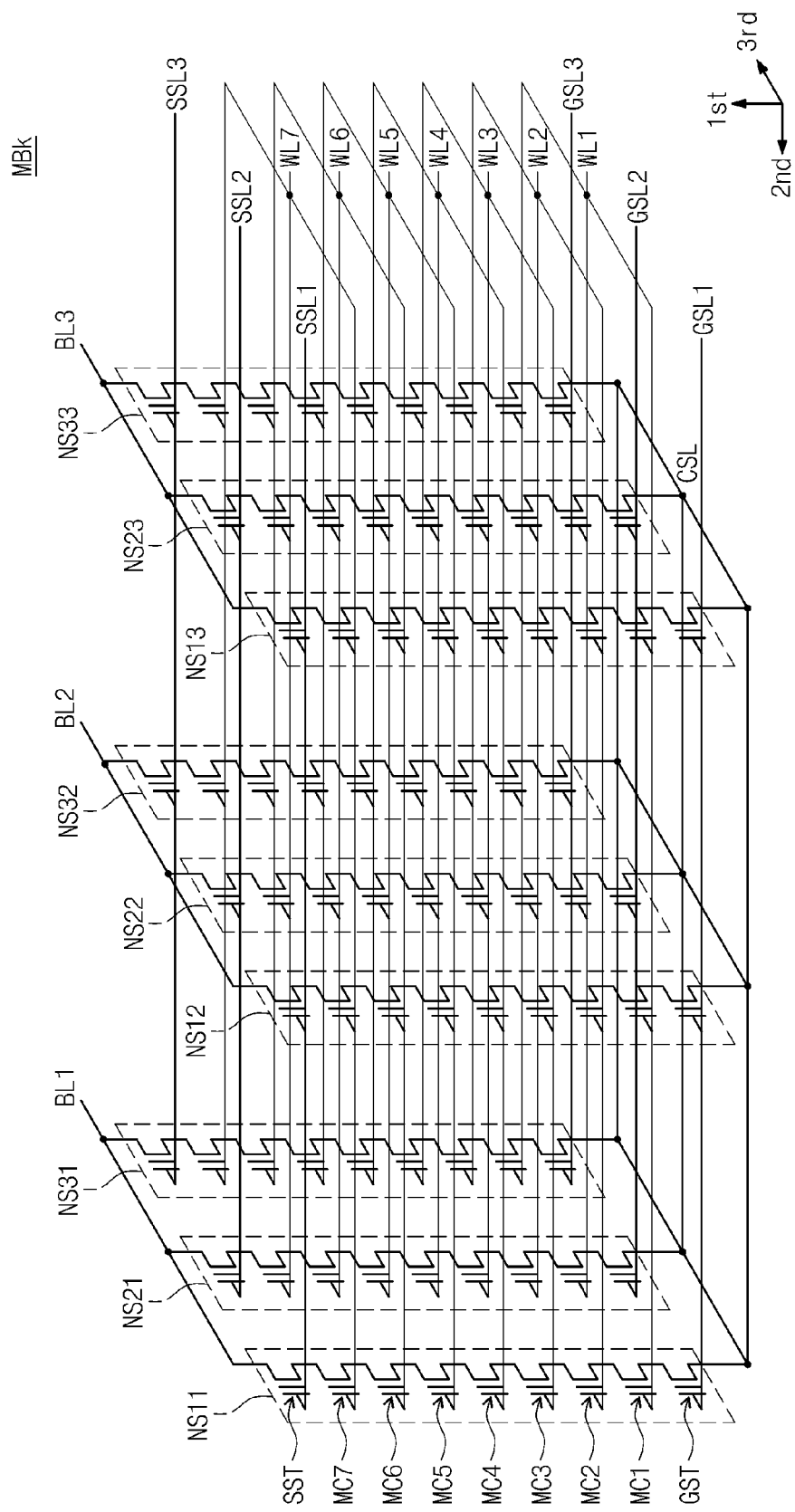
FIG. 13 is a circuit diagram illustrating one of memory blocks illustrated in FIG. 4 according to another exemplary embodiment.

FIG. 13 is a circuit diagram illustrating one of memory blocks illustrated in FIG. 4 according to another exemplary embodiment. Referring to FIG. 13, a memory block MBk (k being one of 0 to 2047) may include vertical strings NS11 to NS31 between a first bit line BL1 and a common source line CSL. The first bit line BL1 may correspond to a conductive material extending along a third direction. Vertical strings NS12, NS22, and NS32 may exist between a second bit line BL2 and the common source line CSL. The second bit line BL2 may correspond to a conductive material extending along the third direction. Vertical strings NS13, NS23, and NS33 may exist between a third bit line BL3 and the common source line CSL. The third bit line BL3 may correspond to a conductive material extending along the third direction.

A string selection transistor SST of each vertical string NS may be connected with a corresponding bit line BL. A ground selection transistor GST of each vertical string NS may be connected with the common source line CSL. Memory cells MC may exist between the string and ground selection transistors SST and GST of each vertical string NS.

Below, rows and columns of the vertical strings NS may be defined. Vertical strings NS connected in common with a bit line may form a column. In an embodiment, the vertical strings NS11 to NS31 connected with the first bit line BL1 may correspond to a first column. The vertical strings NS12 to NS32 connected with the second bit line BL2 may correspond to a second column. The vertical strings NS13 to NS33 connected with the third bit line BL3 may correspond to a third column.

Vertical strings NS connected with one string selection line SSL may form a row. In an embodiment, the vertical strings NS11 to NS13 connected with a first string selection line SSL1 may form a first row. The vertical strings NS21 to NS23 connected with a second string selection line SSL2 may form a second row. The vertical strings NS31 to NS33 connected with a third string selection line SSL3 may form a third row.

Below, heights of each vertical string NS may be defined. In an embodiment, in each vertical string NS, a height of a memory cell MC1 adjacent to a ground selection transistor GST may be 1. In each vertical string NS, a height of a memory cell may increase in proportion to an increase in a distance from a substrate. In each vertical string NS, a height of a memory cell MC7 adjacent to a string selection transistor SST may be 7.

Vertical strings NS of the same row may share a string selection line SSL. Vertical strings NS of different rows may be connected with different string selection lines. In vertical strings NS of the same row, memory cells having the same height may share a word line. Word lines WL of vertical strings NS of different rows at the same height may be connected in common. In an embodiment, word lines WL may be connected in common at a layer where conductive materials extending along a first direction are formed. In an embodiment, the conductive materials extending along the first direction may be connected with an upper layer via contacts. Conductive materials extending along the first direction may be connected in common at an upper layer.

Vertical strings NS of the same row may share a ground selection line GSL. Vertical strings NS of different rows may be connected with different ground selection lines.

The common source line CSL may be connected in common with the vertical strings NS. In an embodiment, first to fourth doping regions can be connected at an active region of the substrate. In an embodiment, the first to fourth doping regions can be connected with an upper layer via contacts. The first to fourth doping regions can be connected in common at the upper layer.

As described in FIG. 13, word lines having the same depth may be connected in common. Accordingly, when a specific word line is selected, all vertical strings NS connected with the specific word line may be selected. Vertical strings NS of different rows may be connected with different string selection lines. Accordingly, vertical strings NS of an unselected row of vertical strings NS connected with the same word line WL may be separated from bit lines BL1 to BL3 by selecting string selection lines SSL1 to SSL3. That is, a row of vertical strings NS may be selected by selecting the string selection lines SSL1 to SSL3. Vertical strings NS of a selected row may be selected by the column by selecting the bit lines BL1 to BL3.

Further and detailed description of a vertical string is disclosed in U.S. Patent Publication Nos. 2009-0310415, 2010-0078701, 2010-0117141, 2010-0140685, 2010-0213527, 2010-0224929, 2010-0315875, 2010-0322000, 2011-0013458, and 2011-0018036, the entirety of which is incorporated by reference herein.

The present disclosure is applicable to a nonvolatile memory device having a memory cell array which is formed of at least two mats.

Figure 14:
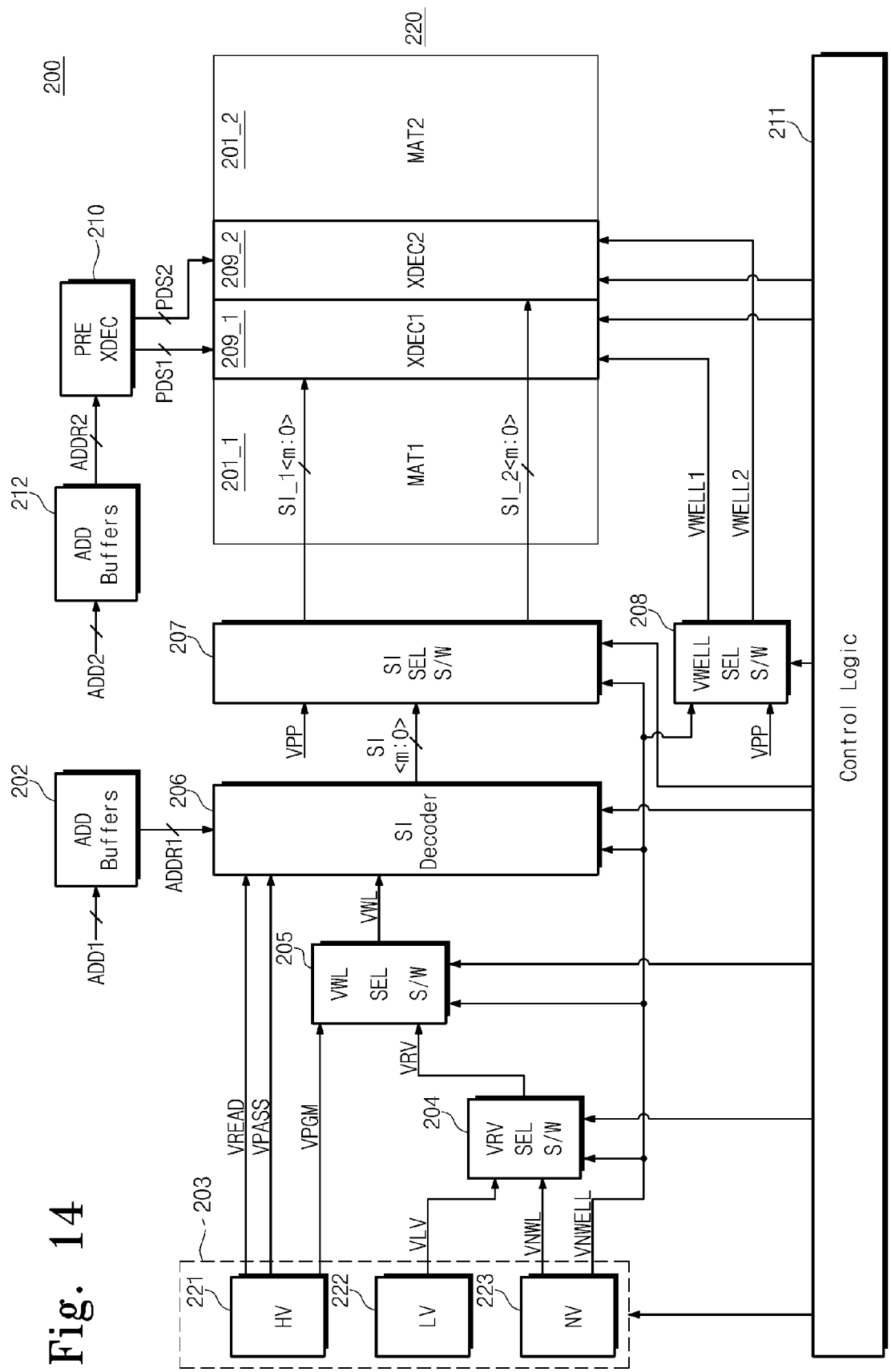
FIG. 14 is a block diagram schematically illustrating a nonvolatile memory device according to another exemplary embodiment.

FIG. 14 is a block diagram schematically illustrating a nonvolatile memory device according to another exemplary embodiment. Referring to FIG. 14, a nonvolatile memory device 200 may include first and second mats 201_1 and 201_2, first and second address buffers 202 and 212, a voltage generator circuit 203, a read verification voltage selecting switch circuit 204, a word line voltage selecting switch circuit 205, a selection line decoder 206, a selection line selecting switch circuit 207, a well voltage selecting switch circuit 208, first and second row decoders 209_1 and 209_2, a pre-decoder 210, and control logic 211.

Each of the first and second mats 201_1 and 201_2 may include a plurality of memory blocks (not shown). Each of the memory blocks may be implemented by a memory block MBj illustrated in FIG. 12 or a memory block MBk illustrated in FIG. 13. The first address buffers 202 include a plurality of address buffers and are configured to receive address input signals ADD1, and to output address output signals ADDR1. The second address buffers 212 include a plurality of address buffers and are configured to receive address input signals ADD2, and to output address output signals ADDR2. Each of the address input signals ADD1 and ADD2 may be received from an external terminal of the nonvolatile memory device. The voltage generator circuit 203, the read verification voltage selecting switch circuit 204, the word line voltage selecting switch circuit 205, and the selection line decoder 206 may be identical to a voltage generator circuit 103, a read verification voltage selecting switch circuit 104, a word line voltage selecting switch circuit 105, and a selection line decoder 106 illustrated in FIG. 1.

The selection line selecting switch circuit 207 may receive a high voltage VPP, and may connect a plurality of selection lines SI<m:0> with one of first selection lines SI_1<m:0> and second selection lines SI_2<m:0> in response to address input signals. In an embodiment, when a negative voltage VNWL is supplied to at least one of the plurality of selection lines SI<m:0>, a well of the selection line selecting switch circuit 207 may be supplied with a negative voltage for a well voltage VNWELL.

The well voltage selecting switch circuit 208 may receive the high voltage VPP and the negative voltage for a well voltage VNWELL, and may supply the negative voltage for a well voltage VNWELL to a well of the first row decoder 209_1 or a well of the second row decoder 209_2 in response to well voltage selection signals. Herein, a voltage supplied to the well of the first row decoder 209_1 may be a first well voltage VWELL1, and a voltage supplied to the well of the second row decoder 209_2 may be a second well voltage VWELL2.

The first row decoder 209_1 may select one of memory blocks included in the first mat 201_1 in response to pre-decoding signals PDS1, and the second row decoder 209_2 may select one of memory blocks included in the second mat 201_2 in response to pre-decoding signals PDS2.

The first row decoder 209_1 may receive bias voltages from the plurality of first selection lines SI_1<m:0> to transfer the input bias voltages to word lines of the selected memory block of the first mat 201_1.

The second row decoder 209_2 may receive bias voltages from the plurality of second selection lines SI_2<m:0> to transfer the input bias voltages to word lines of the selected memory block of the second mat 201_2.

In an embodiment, a well (not shown) of the first row decoder 209_1 and a well (not shown) of the second row decoder 209_2 may be separated from each other. The first well voltage VWELL1 may be supplied to the well of the first row decoder 209_1, and the second well voltage VWELL2 may be supplied to the well of the second row decoder 209_2.

In an embodiment, when one of the bias voltages is a negative voltage, a corresponding well voltage of the first and second well voltages VWELL1 and VWELL2 may be a negative voltage. For example, when a negative voltage is supplied to a word line, selected by address input signals, of a selected memory block of the first mat 201_1, the first well voltage VWELL1 may be a negative voltage.

The first and second row decoders 209_1 and 209_2 may be disposed between the first mat 201_1 and the second mat 201_2. In one embodiment, the first and second row decoders 209_1 and 209_2 and the first mat 201_1 and the second mat 201_2 may be disposed in a memory core region 220. However, the present disclosure is not limited thereto. Further and detailed description associated with disposing of row decoders is disclosed in U.S. Patent Publication No. 2011-0096602, the entirety of which is incorporated by reference herein.

The pre-decoder 210 may decode address output signals ADDR2 to generate the pre-decoding signals PDS1 and PDS2. Herein each of the pre-decoding signals PDS1 and PDS2 may have a high level of a power supply voltage VDD or a low level of the negative voltage VNWELL.

In an embodiment, the pre-decoder 110 may perform a negative level shifting operation where a signal of a ground voltage (0V) is converted into a signal of a negative voltage.

The control logic 211 may include a plurality of control circuits and may be configured to control an overall operation of the nonvolatile memory device 200. The control logic 211 may control the elements 203, 204, 205, 206, 207, 208, 209_1, 209_2, and 210 in response to control signals and a command provided from an external device.

The nonvolatile memory device 200 according to an exemplary embodiment may generate pre-decoding signals PDS corresponding to each of the mats 201_1 and 201_2.

Figure 15:
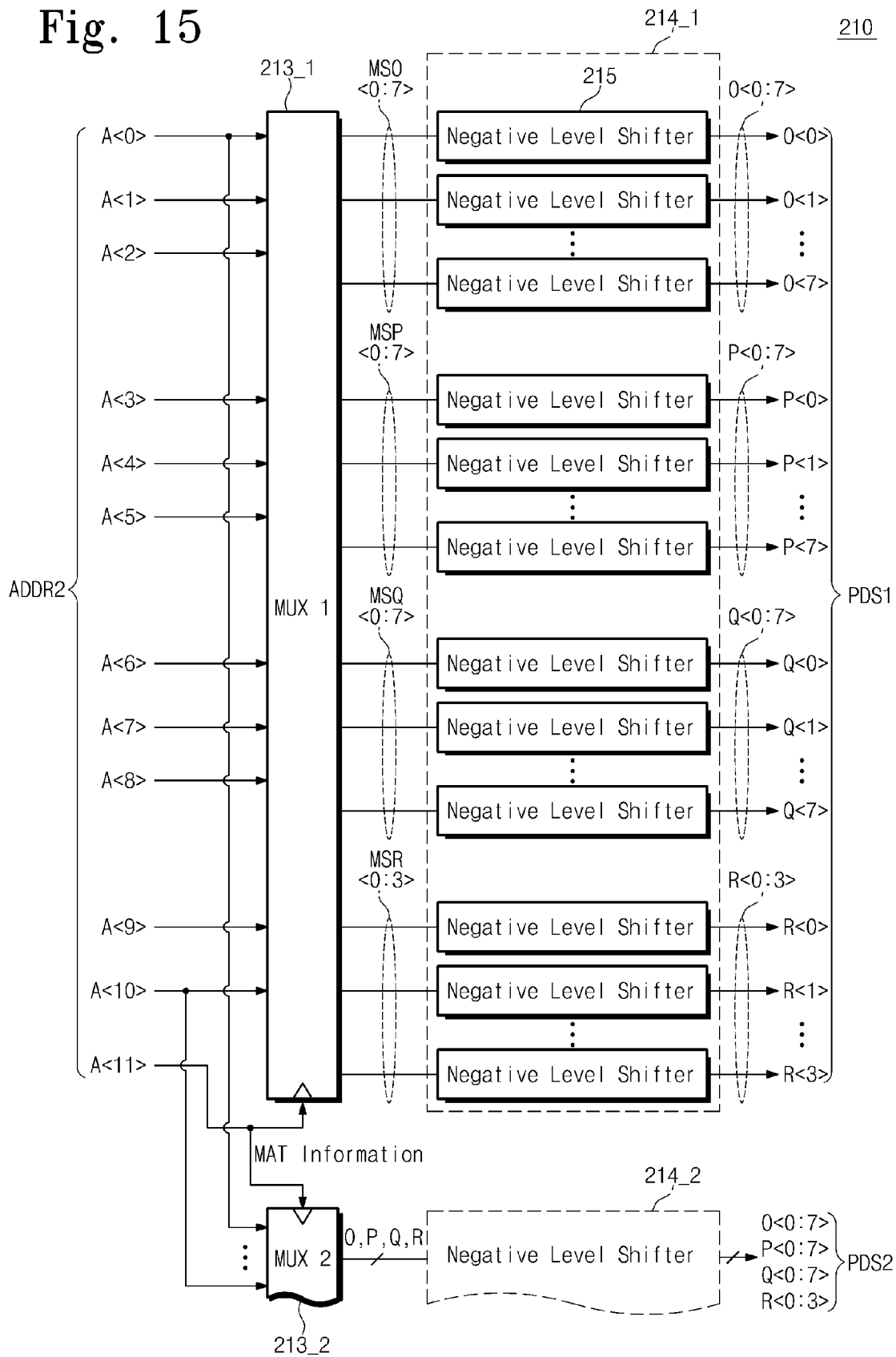
FIG. 15 is a diagram illustrating a pre-decoder illustrated in FIG. 14 according to an exemplary embodiment.

FIG. 15 is a diagram illustrating a pre-decoder illustrated in FIG. 14 according to an exemplary embodiment. Referring to FIG. 15, a pre-decoder 210 may include first and second multiplexers 213_1 and 213_2 and first and second negative level shifters 214_1 and 214_2. The first and second multiplexers 213_1 and 213_2 may be implemented the same as a multiplexer 113 illustrated in FIG. 2, and the first and second negative level shifters 214_1 and 214_2 may be implemented the same as a negative level shifter 114 illustrated in FIG. 2.

The pre-decoder 210 may generate first pre-decoding signals PDS1 or second pre-decoding signals PDS2 in response to a 12-bit address A<0:11>. Each of the 12-bit address A<0:11> may include a normal bit and a complementary bit. An address bit A<11> of the address A<0:11> may include mat information. Activation of the first and second multiplexers 213_1 and 213_2 may be determined according to the address bit A<11> including mat information.

The present disclosure is applicable to various devices.

Figure 16:
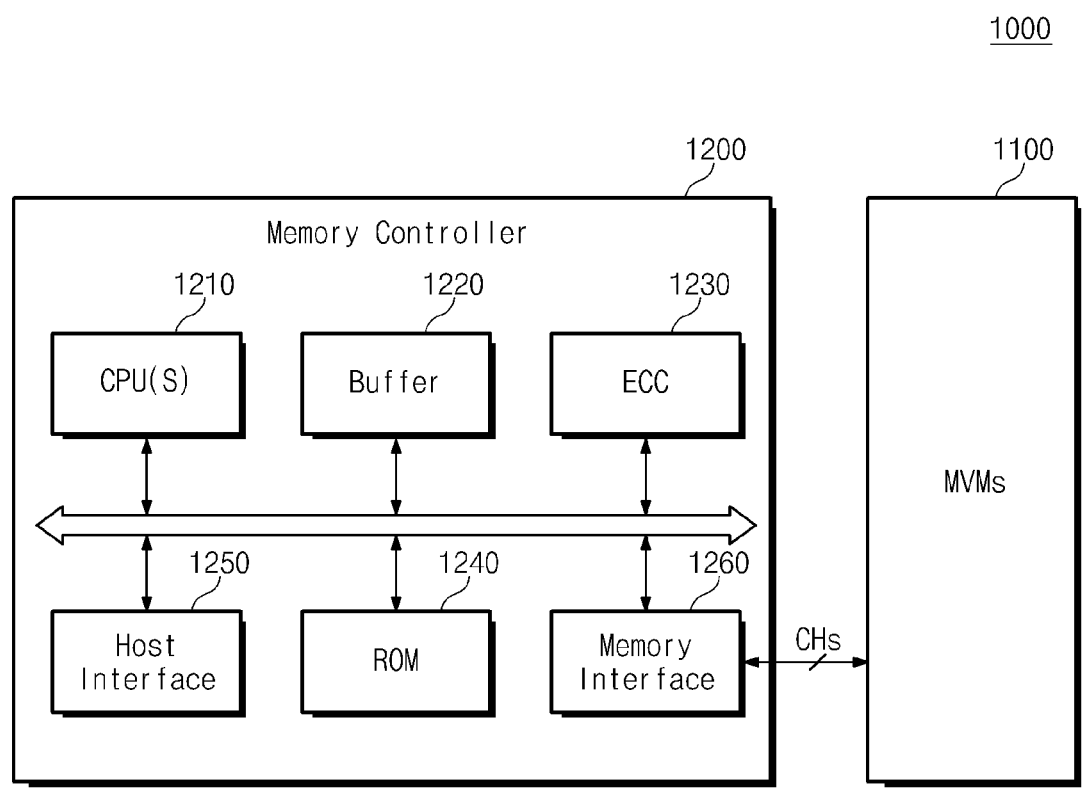
FIG. 16 is a diagram illustrating a memory system according to an exemplary embodiment.

FIG. 16 is a diagram illustrating a memory system according to an exemplary embodiment. Referring to FIG. 16, a memory system 1000 may include at least one nonvolatile memory device 1100 and a memory controller 1200.

The nonvolatile memory device 1100 may be implemented the same as one of those 100 and 200 in FIGS. 1 and 14.

The memory controller 1200 may be connected with the nonvolatile memory device 1100 via a plurality of channels. The memory controller 1200 may include at least one CPU 1210, a buffer memory 1220, an ECC circuit 1230, a ROM 1240, a host interface 1250, and a memory interface 1260. Although not illustrated in FIG. 16, the memory controller 1200 may further include a randomizing circuit which is configured to randomize or de-randomize data. The memory system 1000 according to an exemplary embodiment of the inventive concept may be applied to a Perfect Page New (PPN) device.

The memory system is more fully described in U.S. Patent Publication No. 2010-0082890, the entirety of which is incorporated by reference herein.

Figure 17:
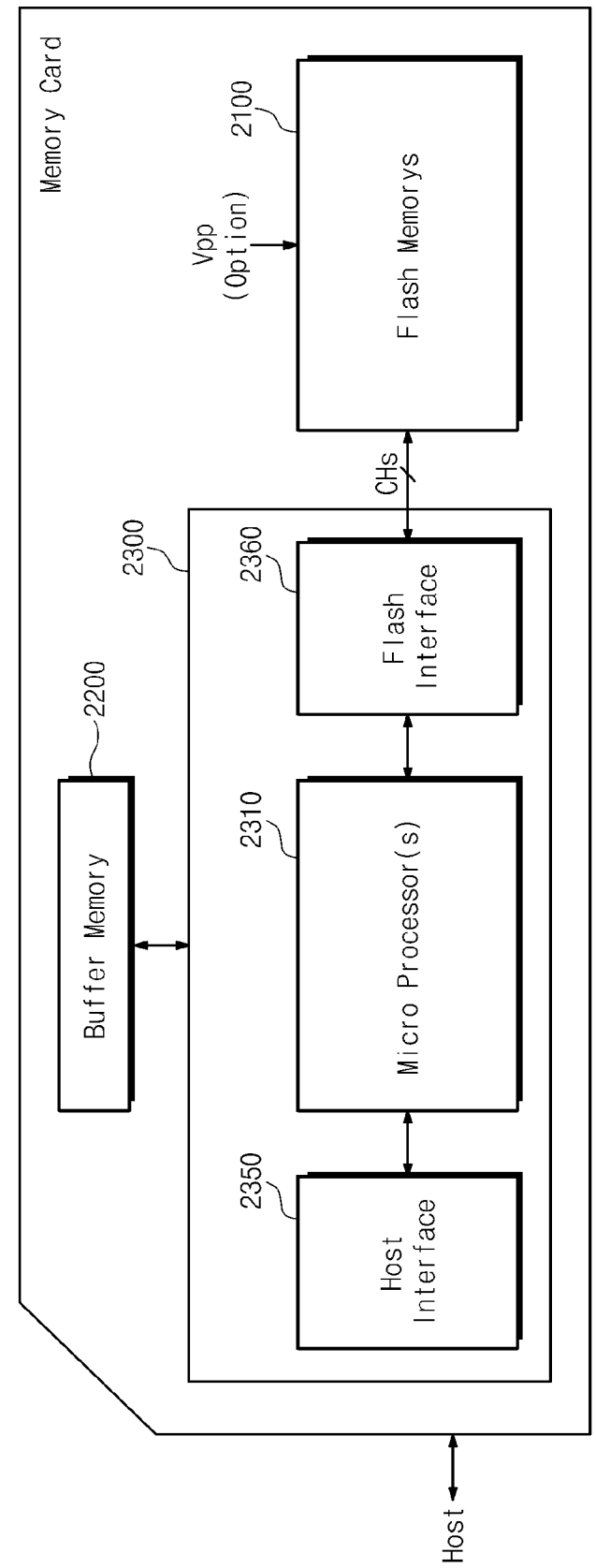
FIG. 17 is a block diagram illustrating a memory card according to an exemplary embodiment.

FIG. 17 is a block diagram illustrating a memory card according to an exemplary embodiment. Referring to FIG. 17, a memory card 2000 may include at least one flash memory 2100, a buffer memory device 2200, and a memory controller 2300 for controlling the flash memory 2100 and the buffer memory device 2200.

The flash memory device 2100 may be implemented the same as one of theses 100 and 200 in FIGS. 1 and 14. In an embodiment, an external high voltage may be optionally supplied to the flash memory device 2100.

The buffer memory device 2200 may be used to temporarily store data generated during the operation of the memory card 2000. The buffer memory device 2200 may be implemented using a DRAM or an SRAM.

The memory controller 2300 may be connected with the flash memory 2100 via a plurality of channels. The memory controller 2300 may be connected between a host and the flash memory 2100. The memory controller 2300 may be configured to access the flash memory 2100 in response to a request from the host.

The memory controller 2300 may include at least one microprocessor 2310, a host interface 2350, and a flash interface 2360. The microprocessor 2310 may be configured to drive firmware. The host interface 2350 may interface with the host via a card protocol (e.g., SD/MMC) for data exchanges between the host and the memory card 2000.

The memory card 2000 may be applicable to Multimedia Cards (MMCs), Security Digitals (SDs), miniSDs, memory sticks, smartmedia, and transflash cards. Detailed description of the memory card 2000 is disclosed in U.S. Patent Publication No. 2010/0306583, the entirety of which is incorporated by reference herein.

Figure 18:
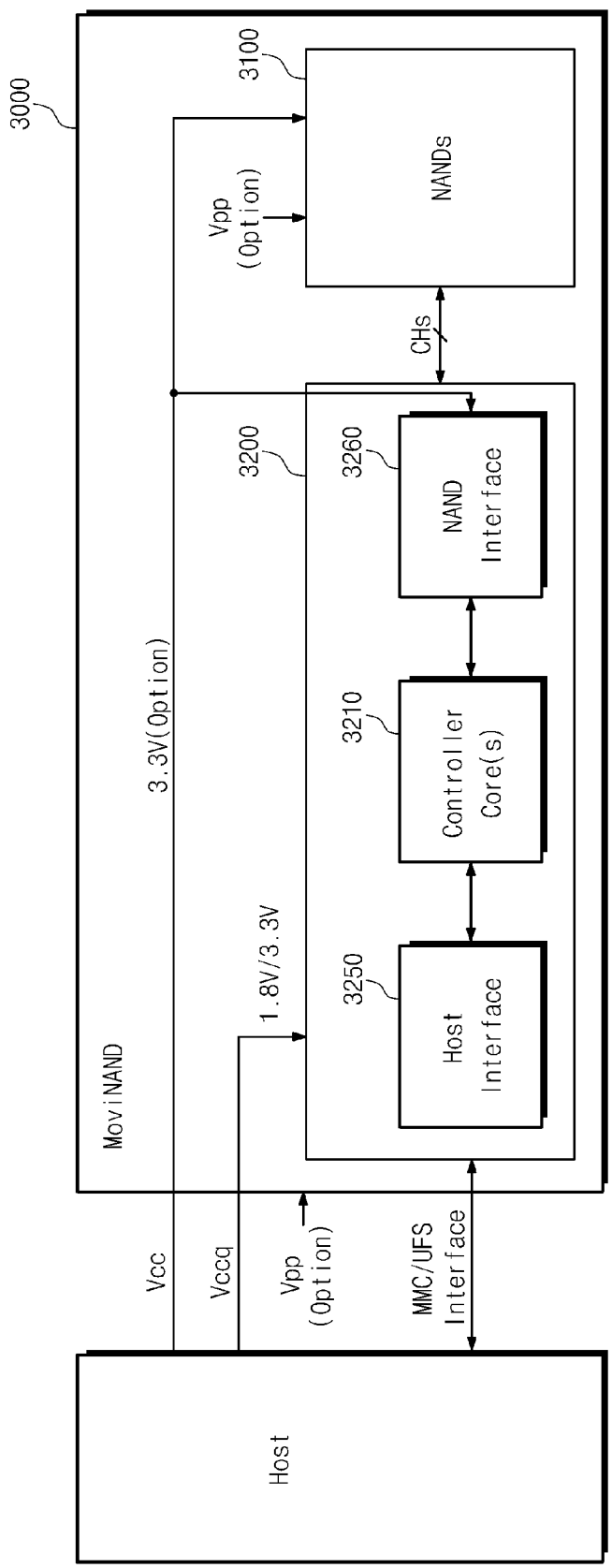
FIG. 18 is a block diagram illustrating a moviNAND according to an exemplary embodiment.

FIG. 18 is a block diagram illustrating a moviNAND according to an exemplary embodiment. Referring to FIG. 18, a moviNAND device 3000 may include at least one NAND flash memory device 3100 and a controller 3200. The moviNAND device 3000 may support the MMC 4.4 (called eMMC) standard. The flash memory device 3100 may be implemented the same as one of those 100 and 200 in FIGS. 1 and 14. The NAND flash memory device 3100 may be a single data rate (SDR) NAND flash memory device or a double data rate (DDR) NAND flash memory device. In an embodiment, the NAND flash memory device 3100 may include NAND flash memory chips. Herein, the NAND flash memory device 3100 may be implemented by stacking the NAND flash memory chips at one package (e.g., FBGA, Fine-pitch Ball Grid Array, etc.).

The controller 3200 may be connected with the flash memory device 3100 via a plurality of channels. The controller 3200 may include at least one controller core 3210, a host interface 3250, and a NAND interface 3260. The controller core 3210 may control an overall operation of the moviNAND device 3000.

The host interface 3250 may be configured to perform an MMC interface between the controller 3210 and a host. The NAND interface 3260 may be configured to interface between the NAND flash memory device 3100 and the controller 3200. In an embodiment, the host interface 3250 may be a parallel interface (e.g., an MMC interface). In another embodiment, the host interface 3250 of the moviNAND device 3000 may be a serial interface (e.g., UHS-II, UFS, etc.).

The moviNAND device 3000 may receive power supply voltages Vcc and Vccq from the host. Herein, the power supply voltage Vcc (about 3V) may be supplied to the NAND flash memory device 3100 and the NAND interface 3250, while the power supply voltage Vccq (about 1.8V/3V) may be supplied to the controller 3200.

In an embodiment, an external high voltage Vpp may be optionally supplied to the moviNAND 3000.

The moviNAND 3000 according to an exemplary embodiment may be advantageous to store mass data as well as may have an improved read characteristic. The moviNAND 3000 according to an exemplary embodiment of the inventive concept is applicable to small and low-power mobile products (e.g., a Galaxy S, iPhone, etc.).

The moviNAND 3000 illustrated in FIG. 18 may be supplied with a plurality of power supply voltages Vcc and Vccq. However, the present disclosure is not limited thereto. The moviNAND 3000 can be configured to generate a power supply voltage of 3.3V suitable for a NAND interface and a NAND flash memory by boosting or regulating the power supply voltage Vcc internally. Internal boosting or regulating is disclosed in U.S. Pat. No. 7,092,308, the entirety of which is incorporated by reference herein.

The present disclosure may be applicable to a solid state drive (SSD).

Figure 19:
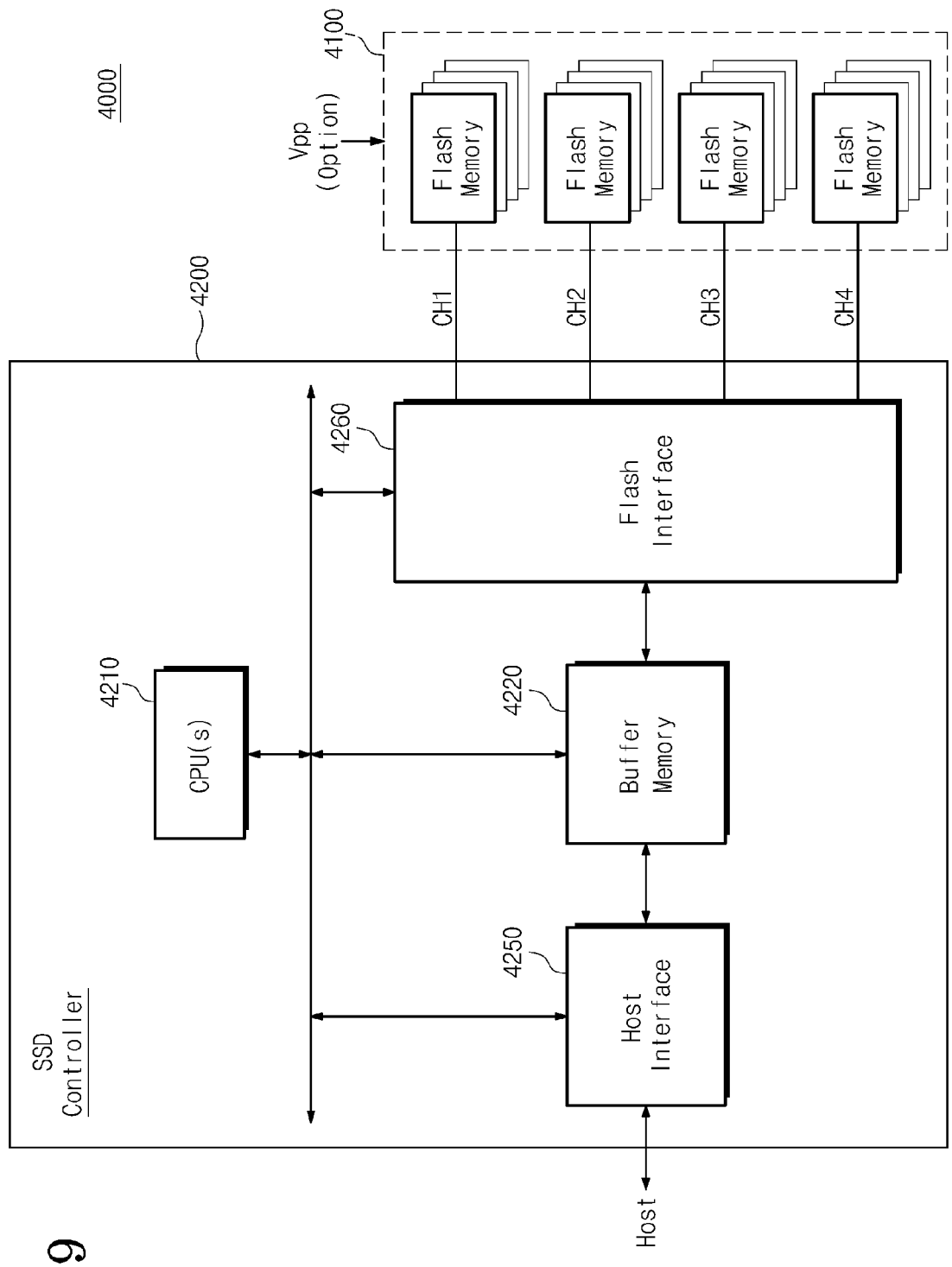
FIG. 19 is a block diagram of an SSD according to an exemplary embodiment.

FIG. 19 is a block diagram of an SSD according to an exemplary embodiment. Referring to FIG. 19, an SSD 4000 may include a plurality of flash memory devices 4100 and an SSD controller 4200.

Each of the flash memory devices 4100 may be implemented the same as one of those 100 and 200 of FIGS. 1 and 14. In an embodiment, an external high voltage Vpp may be optionally supplied to the flash memory devices 4100.

The SSD controller 4200 may be connected with the flash memory devices 4100 via a plurality of channels CH1 to CH4. The SSD controller 4200 may include at least one CPU 4210, a buffer memory 4220, a host interface 4250, and a flash interface 4260.

The buffer memory 4220 may temporarily store data transferred between an external device and the flash memory devices 4100. The buffer memory 4220 may be used to store programs to be executed by the CPU 4210. The buffer memory 4220 may be implemented using an SRAM. The buffer memory 4220 in FIG. 17 may be included within the SSD controller 4200. However, the present disclosure is not limited thereto. The buffer memory 4220 according to an exemplary embodiment can be provided at an outside of the SSD controller 4200.

Under the control of the CPU 4210, the host interface 4250 may exchange data with a host through the communication protocol. The communication protocol may be the ATA protocol. The ATA protocol may include a Serial Advanced Technology Attachment (SATA) interface, a Parallel Advanced Technology Attachment (PATA) interface, an External SATA (ESATA) interface, etc. In another embodiment, the communication protocol may be the Universal Serial Bus (USB) protocol.

Data to be received or transmitted from or to the host through the host interface 4250 may be delivered through the buffer memory 4220 without passing through a CPU bus, under the control of the CPU 4210.

The flash interface 4260 may be configured to interface between the SSD controller 4200 and the flash memory devices 4100 that are used as storage devices. The flash interface 4260 may be configured to support NAND flash memories, One-NAND flash memories, multi-level flash memories, or single-level flash memories.

The SSD 4000 according to an exemplary embodiment may improve the reliability of data by storing random data at a program operation. Accordingly, the reliability of data stored in the SSD 4000 may be improved. More detailed description of the SSD 4000 is disclosed in U.S. Patent Publication No. 2010/0082890, the entirety of which is incorporated by reference herein.

Figure 20:
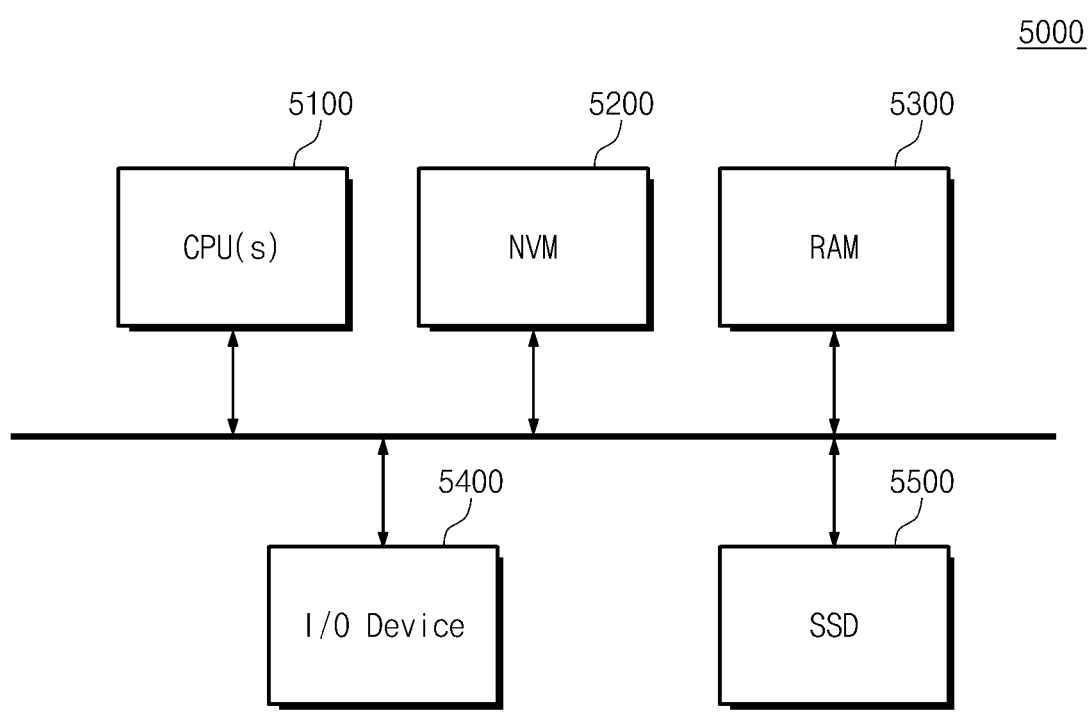
FIG. 20 is a block diagram of a computing system including an SSD in FIG. 19 according to an exemplary embodiment.

FIG. 20 is a block diagram of a computing system including an SSD in FIG. 19 according to an exemplary embodiment. Referring to FIG. 20, a computing system 5000 may include at least one CPU 5100, a nonvolatile memory device 5200, a RAM 5300, an input/output (I/O) device 5400, and an SSD 5500.

The CPU 5100 may be connected to a system bus. The nonvolatile memory device 5200 may store data used to drive the computing system 5000. Herein, the data may include a start command sequence or a basic I/O system (BIOS) sequence. The RAM 5300 may temporarily store data generated during the execution of the CPU 5100.

The I/O device 5400 may be connected to the system bus through an I/O device interface such as keyboards, pointing devices (e.g., mouse), monitors, modems, and the like.

The SSD 5500 may be a readable storage device and may be implemented the same as the SSD 4000 of FIG. 19.

Figure 21:
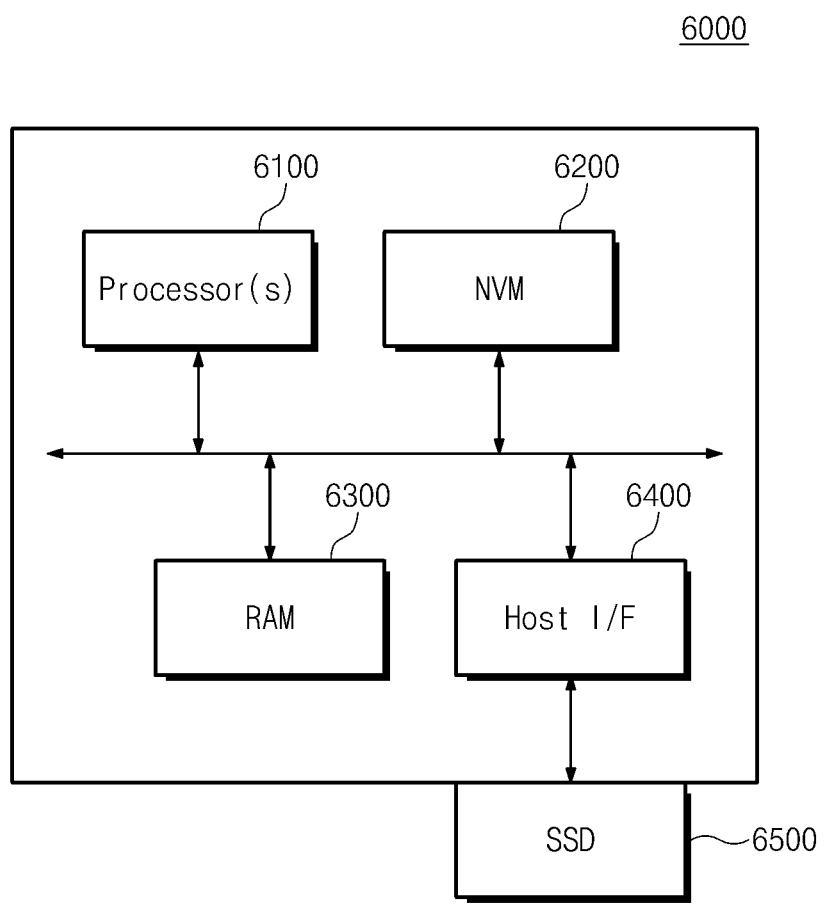
FIG. 21 is a block diagram of an electronic device including an SSD in FIG. 19 according to an exemplary embodiment.

FIG. 21 is a block diagram of an electronic device including an SSD in FIG. 19 according to an exemplary embodiment of the inventive concept. Referring to FIG. 21, an electronic device 6000 may include a processor 6100, a ROM 6200, a RAM 6300, a flash interface 6400, and at least one SSD 6500.

The processor 6100 may access the RAM 6300 to execute firmware codes or other codes. Also, the processor 6100 may access the ROM 6200 to execute fixed command sequences such as a start command sequence and a basic I/O system (BIOS) sequence. The flash interface 6400 may be configured to interface between the electronic device 6000 and the SSD 6500.

The SSD 6500 may be detachable from the electronic device 6000. The SSD 6500 may be implemented the same as the SSD 4000 of FIG. 19.

The electronic device 6000 may include cellular phones, personal digital assistants (PDAs), digital cameras, camcorders, portable audio players (e.g., MP3), and portable media players (PMPs).

Figure 22:
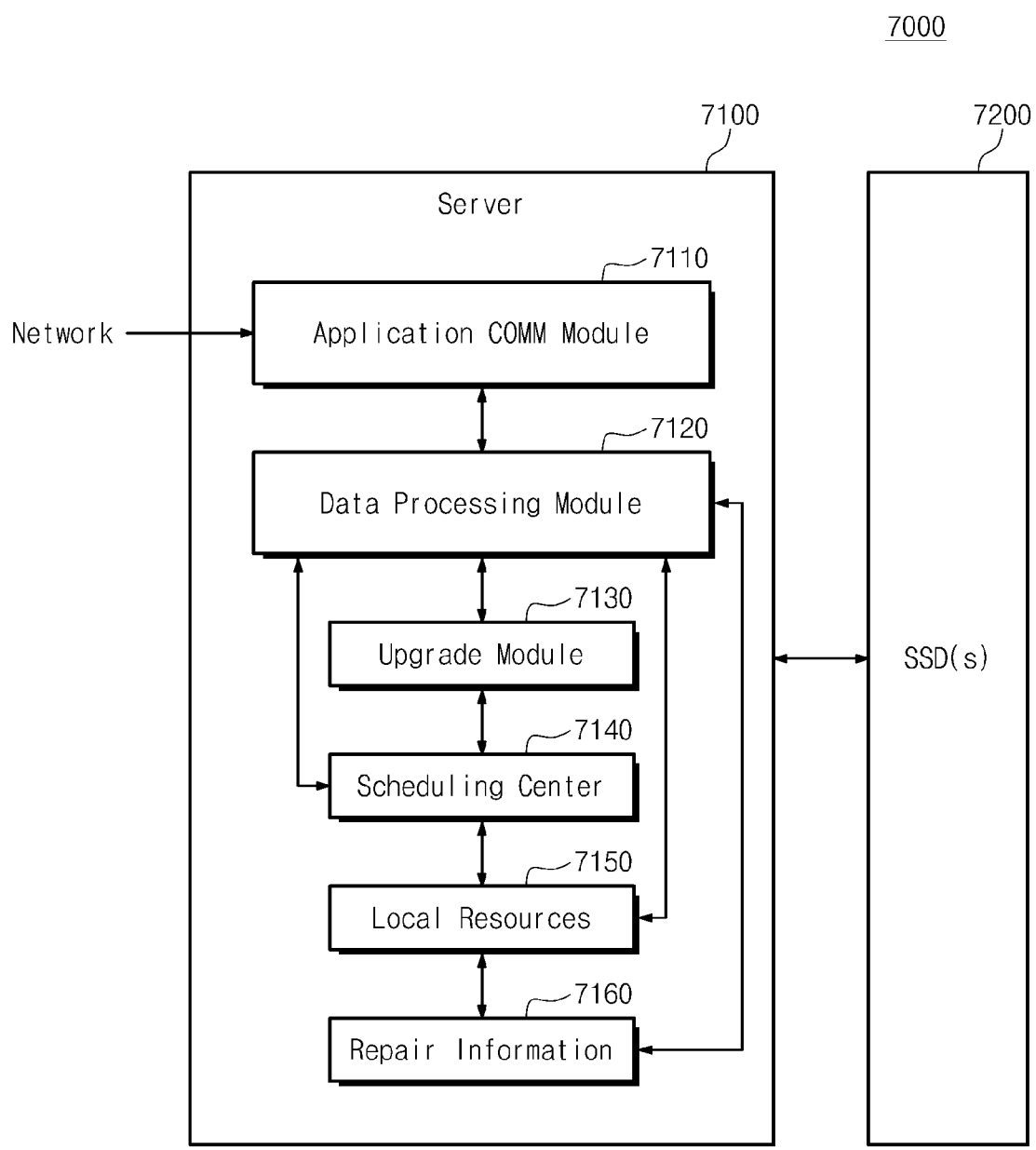
FIG. 22 is a block diagram of a server system including an SSD in FIG. 19 according to an exemplary embodiment.

FIG. 22 is a block diagram of a server system including an SSD in FIG. 19 according to an exemplary embodiment. Referring to FIG. 22, a server system 7000 may include a server 7100 and at least one SSD 7200 that stores data used to drive the server 7100. The SSD 7200 may be configured the same as an SSD 4000 of FIG. 19.

The server 7100 may include an application communication module 7110, a data processing module 7120, an upgrade module 7130, a scheduling center 7140, a local resource module 7150, and a repair information module 7160.

The application communication module 7110 may be configured to communicate with a computing system connected to a network and the server 7100, or to allow the server 7100 to communicate with the SSD 7200. The application communication module 7110 may transmit data or information, provided through a user interface, to the data processing module 7120.

The data processing module 7120 may be linked to the local resource module 7150. Here, the local resource module 7150 may provide a list of repair shops/dealers/technical information to a user on the basis of information or data inputted to the server 7100.

The upgrade module 7130 may interface with the data processing module 7120. Based on information or data received from the SSD 7200, the upgrade module 7130 may perform upgrades of a firmware, a reset code, a diagnosis system, or other information on electronic appliances.

The scheduling center 7140 may provide real-time options to the user based on the information or data inputted to the server 7100.

The repair information module 7160 may interface with the data processing module 7120. The repair information module 7160 may be used to provide repair-related information (e.g., audio, video or document files) to the user. The data processing module 7120 may package information related to the information received from the SSD 7200. The packaged information may be transmitted to the SSD 7200 or may be displayed to the user.

A non-volatile memory device according to an exemplary embodiment may be applicable to a Perfect Page New (PPN) device.

Figure 23:
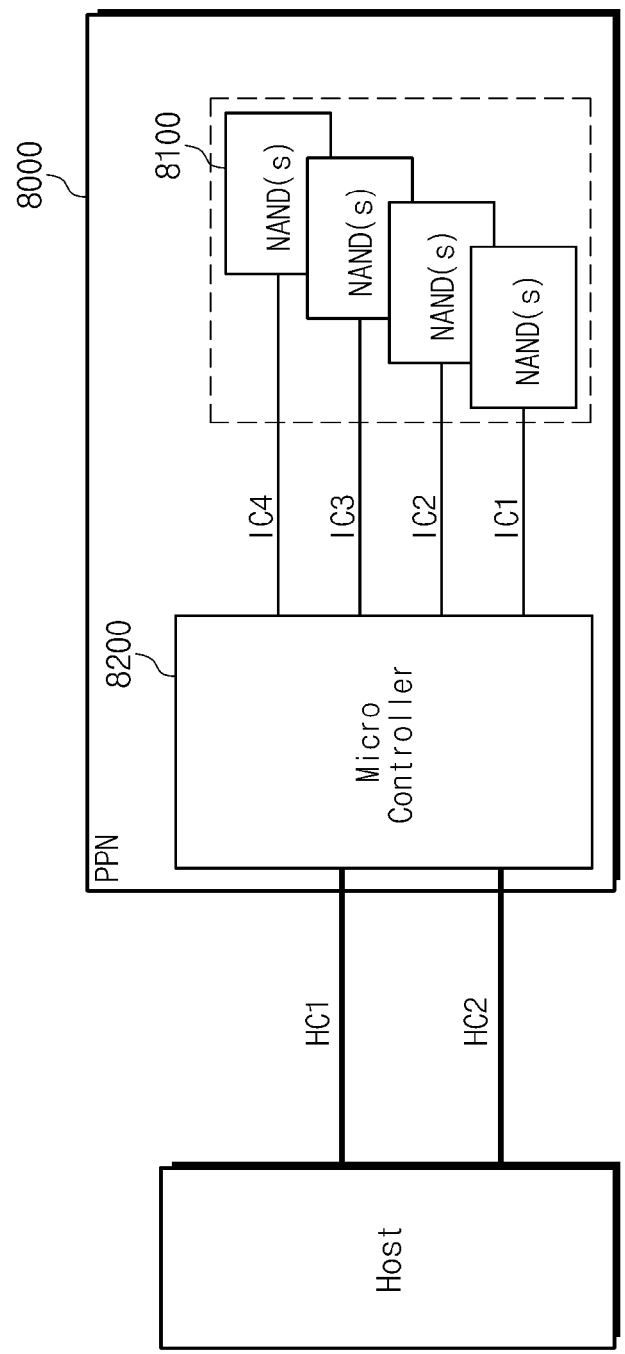
FIG. 23 is a block diagram illustrating a PPN device according to an exemplary embodiment.

FIG. 23 is a block diagram illustrating a PPN device according to an exemplary embodiment. Referring to FIG. 23, a PPN device 8000 may include a plurality of NAND flash memories 8100 and a controller 8200 for controlling the plurality of NAND flash memories 8100.

The PPN device 8000 may communicate with a host via the PPN protocol having a DDR (double data rate) interface. Data communication between the PPN device 8000 and the host may be made via first and second host channels HC1 and HC2. Herein, the number of host channels is not limited to 2. The PPN device 8000 may guarantee the reliability of data such that the host does not include an ECC engine. For example, the PPN device 8000 may guarantee 3000 program/erase cycles over three years.

The NAND flash memory devices 8100 may be implemented the same as one of those 100 and 200 in FIG. 1.

The controller 8200 may be connected with the NAND flash memories 8100 via a plurality of channels IC1 to IC4.

Data communication between the NAND flash memories 8100 and the controller 8200 may be made via the inner channels IC1 to IC4. Herein, the number of inner channels is not limited to 4.

A memory system according to an exemplary embodiment may be applicable to a tablet product (e.g., Galaxy S, iPad, etc.).

Figure 24:
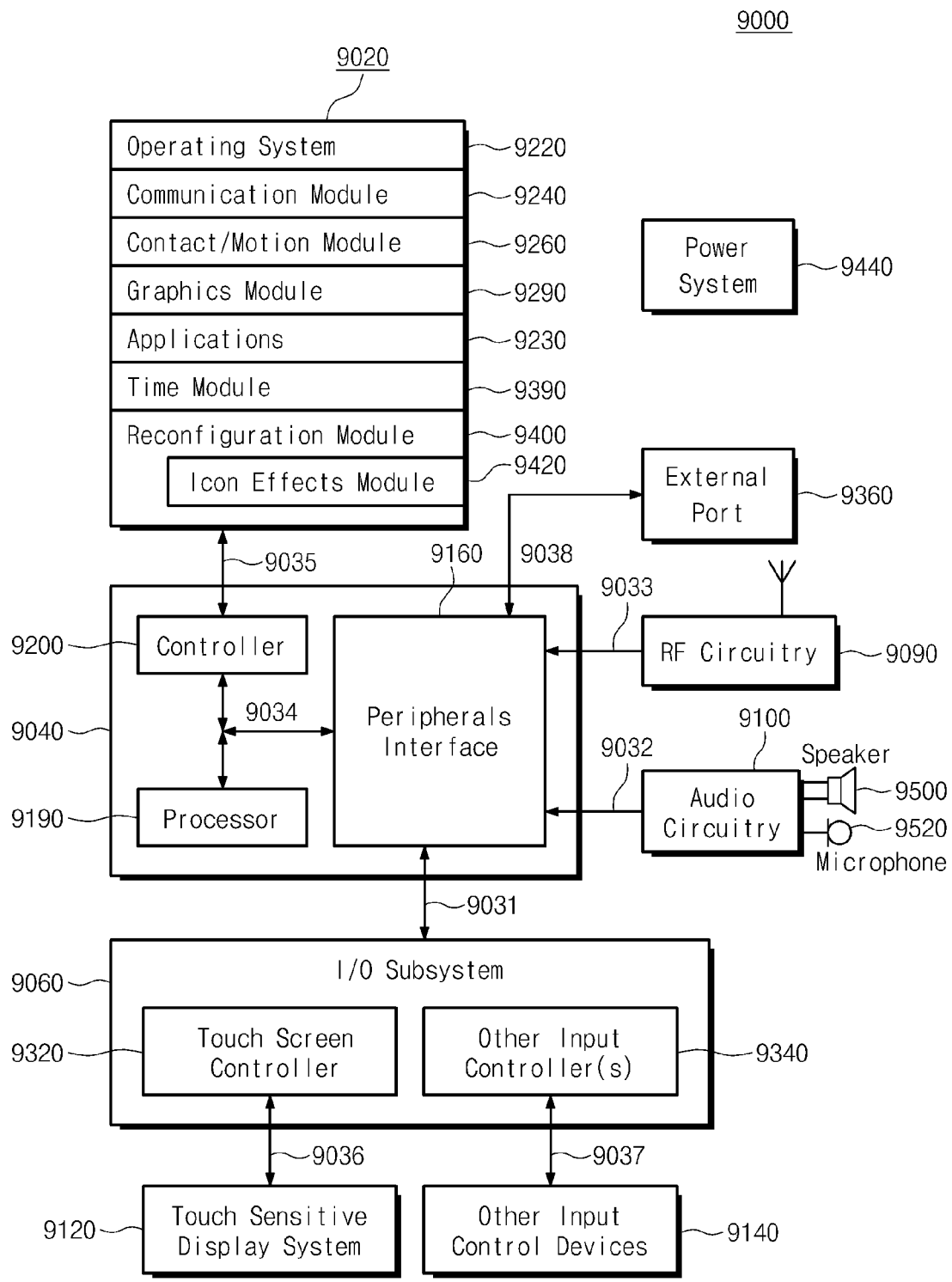
FIG. 24 is a diagram showing a handheld electronic device according to an exemplary embodiment.

FIG. 24 is a diagram showing a handheld electronic device according to an exemplary embodiment. Referring to FIG. 24, a handheld electronic device 9000 may include at least one computer-readable media 9020, a processing system 9040, an input/output sub-system 9060, a radio frequency circuit 9080, and an audio circuit 9100. Respective constituent elements can be interconnected by at least one communication bus or a signal line 9030.

The handheld electronic device 9000 may be any handheld electronic device including a handheld computer, a tablet computer, a mobile phone, a media player, a PDA, or a combination of at least two elements thereof Herein, the at least one computer-readable media 9020 may include one of those 100 and 200 in FIGS. 1 and 14. More detailed description of the handheld electronic device 9000 is disclosed in U.S. Pat. No. 7,509,588, the entirety of which is incorporated by reference herein.

A memory system or a storage device according to the present disclosure may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device comprising:
   memory blocks, each of the memory blocks having a plurality of memory cells;
   address buffers configured to output address signals;
   a pre-decoder including:
      a multiplexer configured to generate multiplexing signals in response to the address signals; and
      negative level shifters, each of the negative level shifters configured to generate a converted multiplexing signal corresponding to a multiplexing signal by converting a multiplexing signal having a ground voltage into a converted multiplexing signal having a first negative voltage; and
   a row decoder configured to generate a block selecting signal by decoding the converted multiplexing signal, and to select at least one of the memory blocks in response to the block selecting signal.

2. The nonvolatile memory device of claim 1, wherein the memory blocks and the row decoder are disposed in a memory cell core region, and wherein the pre-decoder is disposed in a peripheral region different from the memory cell core region.

3. The nonvolatile memory device of claim 1, wherein each of the negative level shifters is configured to convert a multiplexing signal having a power supply voltage into a converted multiplexing signal having the power supply voltage.

4. The nonvolatile memory device of claim 3, wherein each of the negative level shifters comprises:
   a PMOS transistor connected between a power supply terminal supplied with the power supply voltage and an output terminal and configured to receive the multiplexing signal having the power supply voltage and to output the converted multiplexing signal having the power supply voltage to the output terminal; and
   an NMOS transistor connected between the output terminal and a negative voltage terminal supplied with the first negative voltage and configured to receive the multiplexing signal having the ground voltage and to output the converted multiplexing signal having the first negative voltage to the output terminal,
   wherein a body terminal of the NMOS transistor is connected to the negative voltage terminal.

5. The nonvolatile memory device of claim 1, wherein the row decoder comprises:
   decoding units, each of the decoding units corresponding to a memory block, configured to generate the block selecting signal to select at least one of the memory blocks in response to at least two of the converted multiplexing signals.

6. The nonvolatile memory device of claim 5, wherein each of the decoding units comprises:
   a combinational logic circuit configured to generate a voltage transfer enable signal in response to the at least two converted multiplexing signals, the voltage transfer enable signal having one of the power supply voltage and the first negative voltage;
   a pull-up circuit configured to provide a high voltage higher than the power supply voltage to the block selecting signal when the voltage transfer enable signal has the power supply voltage;
   a pull-down circuit configured to provide the first negative voltage to the block selecting signal when the voltage transfer enable signal has the first negative voltage; and
   a voltage transfer circuit configured to transfer voltages of selection lines to the word lines of a corresponding memory block in response to the block selecting signal.

7. The nonvolatile memory device of claim 5, further comprising:
   word lines connected to the plurality of memory cells; and
   a selection line decoder configured to provide voltages to the word lines in response to the block selecting signal.

8. The nonvolatile memory device of claim 7, wherein a well of each of the decoding units is connected to a negative voltage terminal, and the first negative voltage is supplied to the negative voltage terminal when a second negative voltage is supplied to at least one of the word lines of the selected memory block.

9. The nonvolatile memory device of claim 8, further configured such that a voltage of the negative voltage terminal of the decoding unit corresponding to the selected memory block is lowered to the first negative voltage after a first delay time when the converted multiplexing signal transit to the first negative voltage and is increased up to the ground voltage before a second delay time when the converted multiplexing signal is increased to the ground voltage from the first negative voltage.

10. The nonvolatile memory device of claim 8, wherein the second negative voltage for at least one of the word lines is identical to or higher than the first negative voltage.

11. A memory device comprising:
a memory cell array including one or more memory blocks, each of the one or more memory bocks having a plurality of memory cell transistors;
word lines connected to the plurality of memory cell transistors;
first address buffers configured to output first address signals;
second address buffers configured to output second address signals;
a selection line decoder configured to generate selection line signals in response to the first address signals;
a pre-decoder including:
 a multiplexer configured to generate multiplexing signals in response to the second address signals; and
 negative level shifters, each of the negative level shifters configured to generate a converted multiplexing signal corresponding to a multiplexing signal by converting a multiplexing signal having a ground voltage into a converted multiplexing signal having a negative voltage; and
a row decoder configured to generate a block selecting signal by decoding the converted multiplexing signal, and to select at least one of the word lines in response to the block selecting signal and the selection line signals.

12. The memory device of the claim 11, wherein the memory cell array and the row decoder are disposed in a memory cell core region, and wherein the pre-decoder is disposed in a peripheral region different from the memory cell core region.

13. The memory device of claim 11, wherein a level of each of the multiplexing signals is a ground voltage or a power supply voltage, and wherein a level of each of the converted multiplexing signals is the negative voltage or the power supply voltage.

14. The memory device of claim 11, wherein the row decoder comprises:
a block selection circuit configured to generate the block selecting signal to select at least one block of the one or more memory blocks in response to the converted multiplexing signals; and
a voltage transfer circuit configured to transfer the selection line signals to corresponding word lines of the selected memory block.

15. The memory device of claim 14, wherein the block selecting signal has the negative voltage or a higher voltage greater than a power supply voltage.

16. The memory device of claim 15, wherein the each of the negative level shifters comprises:
a PMOS transistor connected between a power supply terminal supplied with the power supply voltage and an output terminal and configured to receive the multiplexing signal having the power supply voltage and to output the converted multiplexing signal having the power supply voltage to the output terminal; and
an NMOS transistor connected between the output terminal and a negative voltage terminal supplied with the negative voltage and configured to receive the multiplexing signal having the ground voltage and to output the converted multiplexing signal having the negative voltage to the output terminal,
wherein a body terminal of the NMOS transistor is connected to the negative voltage terminal.

17. A nonvolatile memory device comprising:
a first mat having first memory blocks;
a second mat having second memory blocks;
address buffers configured to output first and second address signals; and
a pre-decoder including:
 a first multiplexer and a second multiplexer configured to generate first and second pre-decoding signals in response to the first and second address signals, respectively;
 first negative level shifters, each of the first negative level shifters configured to generate a first converted pre-decoding signal corresponding to a respective first pre-decoding signal by converting a first pre-decoding signal having a ground voltage into a first converted pre-decoding signal having a negative voltage; and
 second negative level shifters, each of the second negative level shifters configured to generate a second converted pre-decoding signal corresponding to a respective second pre-decoding signal by converting a second pre-decoding signal having the ground voltage into a second converted pre-decoding signal having the negative voltage;
a first row decoder configured to select one of the first memory blocks in response to the first converted pre-decoding signals; and
a second row decoder configured to select one of the second memory blocks in response to the second converted pre-decoding signals.

18. The memory device of the claim 17, wherein the first and second memory blocks and the first and second row decoders are disposed in a memory cell core region, and wherein the first and second pre-decoders are disposed in a peripheral region different from the memory cell core region.

19. The nonvolatile memory device of claim 17, further comprising:
a well voltage selecting switch circuit configured to switch the negative voltage into a well of the first row decoder or a well of the second row decoder;
a selection line selecting switch circuit configured to switch voltage to be supplied to selection lines into first selection lines corresponding to the first row decoder or second selection lines corresponding to the second row decoder;
a selection line decoder configured to transfer a selection word line voltage and non-selection word line voltages to the selection lines;
a word line voltage selecting switch circuit configured to select one of a program voltage and a read verification voltage as the selection word line voltage; and
a read verification voltage selecting switch circuit configured to select one of a first voltage and the negative voltage for a word line as the read verification voltage,
wherein when the negative voltage is supplied to a selected word line, the negative voltage is supplied to a well of the well voltage selecting switch circuit, a well of the selection line selecting switch circuit, a well of the selection line decoder, a well of the word line voltage selecting switch circuit, and a well of the read verification voltage selecting switch circuit.

20. The nonvolatile memory device of claim 19, further comprising:

a negative voltage generator configured to generate the negative voltage identical in level to the negative voltage for a word line voltage.

* * * * *